(12) United States Patent
Vorbach et al.

(10) Patent No.: US 6,338,106 B1
(45) Date of Patent: Jan. 8, 2002

(54) I/O AND MEMORY BUS SYSTEM FOR DFPS AND UNITS WITH TWO OR MULTI-DIMENSIONAL PROGRAMMABLE CELL ARCHITECTURES

(75) Inventors: Martin Vorbach; Robert Münch, both of Karlsruhe (DE)

(73) Assignee: PACT GmbH (DE)

( * ) Notice: Subject to any disclaimer, the term of this patent is extended or adjusted under 35 U.S.C. 154(b) by 0 days.

(21) Appl. No.: 09/335,974

(22) Filed: Jun. 18, 1999

Related U.S. Application Data

(63) Continuation of application No. PCT/DE97/03013, filed on Dec. 21, 1997, and a continuation-in-part of application No. 08/947,254, filed on Oct. 8, 1997, now Pat. No. 6,119,181.

(30) Foreign Application Priority Data

Dec. 20, 1996 (DE) .......................................... 196 54 595

(51) Int. Cl.[7] .......................... G06F 13/00; G06F 13/40; G06F 15/80
(52) U.S. Cl. ............................ 710/100; 712/11; 716/16
(58) Field of Search ................................. 710/100, 101, 710/8, 72, 126; 712/11, 14, 18; 716/17, 16; 326/38, 39, 41

(56) References Cited

U.S. PATENT DOCUMENTS

| | | |
|---|---|---|
| 4,489,857 A | 12/1984 | Batlas |
| 4,591,979 A | 5/1986 | Iwashita |
| 4,706,216 A | 11/1987 | Carter |
| 4,739,474 A | 4/1988 | Holsztynski et al. |
| 4,761,755 A | 8/1988 | Ardini et al. |
| 4,811,214 A | 3/1989 | Nosenchuck et al. |
| 4,852,048 A | 7/1989 | Morton |
| 4,870,302 A | 9/1989 | Freeman |
| 4,901,268 A | 2/1990 | Judd |

(List continued on next page.)

FOREIGN PATENT DOCUMENTS

| | | |
|---|---|---|
| DE | 44 16 881 | 11/1994 |
| DE | 196 54 595 | 7/1998 |
| DE | 196 54 846 | 7/1998 |
| DE | 197 04 728 | 8/1998 |
| DE | 196 51 075 | 10/1998 |
| EP | 0 221 360 | 5/1987 |
| EP | 0428327 A1 | 5/1991 |
| EP | 748 051 A2 | 12/1991 |
| EP | 0539595 A1 | 5/1993 |
| EP | 0 678 985 | 10/1995 |
| EP | 0707269 A | 4/1996 |
| EP | 0 726 532 | 8/1996 |
| EP | 735 685 | 10/1996 |
| EP | 0735685 | 10/1996 |
| EP | 0748051 A2 | 12/1996 |
| WO | A9004835 | 5/1990 |
| WO | WO90/11648 | 10/1990 |
| WO | A9311503 | 6/1993 |
| WO | 94/08399 | 4/1994 |
| WO | 95/00161 | 1/1995 |
| WO | 95/26001 | 9/1995 |

OTHER PUBLICATIONS

Villasenor, John, et al., "Configurable Computing." *Scientific American*, vol. 276, No. 6, Jun. 1997, pp. 66–71.

(List continued on next page.)

*Primary Examiner*—Gopal C. Ray
(74) *Attorney, Agent, or Firm*—Kenyon & Kenyon

(57) ABSTRACT

A general bus system is provided which combines a number of internal lines and leads them as a bundle to the terminals. The bus system control is predefined and does not require any influence by the programmer. Any number of memories, peripherals or other units can be connected to the bus system (for cascading).

18 Claims, 18 Drawing Sheets

U.S. PATENT DOCUMENTS

| | | |
|---|---|---|
| 4,967,340 A | 10/1990 | Dawes |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,043,978 A | 8/1991 | Nagler et al. |
| 5,081,375 A | 1/1992 | Pickett et al. |
| 5,109,503 A | 4/1992 | Cruickshank et al. |
| 5,113,498 A | 5/1992 | Evan et al. |
| 5,115,510 A | 5/1992 | Okamoto et al. |
| 5,123,109 A | 6/1992 | Hillis |
| 5,125,801 A | 6/1992 | Nabity et al. |
| 5,128,559 A | 7/1992 | Steele |
| 5,142,469 A | 8/1992 | Weisenborn |
| 5,204,935 A | 4/1993 | Mihara et al. |
| 5,208,491 A | 5/1993 | Ebeling et al. |
| 5,226,122 A | 7/1993 | Thayer et al. |
| RE34,363 E | 8/1993 | Freeman |
| 5,233,539 A | 8/1993 | Agrawal et al. |
| 5,247,689 A | 9/1993 | Ewert |
| 5,287,472 A | 2/1994 | Horst |
| 5,301,344 A | 4/1994 | Kolchinsky |
| 5,303,172 A | 4/1994 | Magar et al. |
| 5,336,950 A | 8/1994 | Popli et al. |
| 5,361,373 A | 11/1994 | Gilson |
| 5,410,723 A | 4/1995 | Schmidt et al. |
| 5,418,952 A | 5/1995 | Morley et al. |
| 5,421,019 A | 5/1995 | Holsztynski et al. |
| 5,422,823 A | 6/1995 | Agrawal et al. |
| 5,426,378 A | 6/1995 | Ong |
| 5,430,687 A | 7/1995 | Hung et al. |
| 5,440,245 A | 8/1995 | Galbraith et al. |
| 5,442,790 A | 8/1995 | Nosenchuck |
| 5,444,394 A | 8/1995 | Watson et al. |
| 5,448,186 A | 9/1995 | Kawata |
| 5,455,525 A | 10/1995 | Ho et al. |
| 5,457,644 A | 10/1995 | McCollum |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,497,498 A | 3/1996 | Taylor |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemney et al. |
| 5,555,434 A | 9/1996 | Carlstedt |
| 5,559,450 A | 9/1996 | Ngai et al. |
| 5,561,738 A | 10/1996 | Kinerk et al. |
| 5,570,040 A | 10/1996 | Lytle et al. |
| 5,583,450 A | 12/1996 | Trimberger et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,358 A | 12/1996 | Barker et al. |
| 5,596,742 A | 1/1997 | Agrawal et al. |
| 5,617,547 A | 4/1997 | Feeney et al. |
| 5,634,131 A | 5/1997 | Matter et al. |
| 5,652,894 A | 7/1997 | Hu et al. |
| 5,655,124 A | 8/1997 | Lin |
| 5,659,797 A | 8/1997 | Zandveld et al. |
| 5,713,037 A | 1/1998 | Wilkinson et al. |
| 5,717,943 A | 2/1998 | Barker et al. |
| 5,734,921 A | 3/1998 | Dapp et al. |
| 5,742,180 A | 4/1998 | DeHon et al. |
| 5,748,872 A | 5/1998 | Norman |
| 5,754,871 A | 5/1998 | Wilkinson et al. |
| 5,761,484 A | 6/1998 | Agarwal et al. |
| 5,773,994 A * | 6/1998 | Jones |
| 5,778,439 A | 7/1998 | Timberger et al. |
| 5,801,715 A | 9/1998 | Norman |
| 5,828,858 A | 10/1998 | Athanas et al. |
| 5,974,059 A | 10/1998 | Barker et al. |
| 5,838,165 A | 11/1998 | Chatter |
| 5,844,888 A | 12/1998 | Markkula, Jr. et al. |
| 5,867,691 A | 2/1999 | Shiraishi |
| 5,892,961 A | 4/1999 | Trimberger |
| 5,915,123 A | 6/1999 | Mirsky et al. |
| 5,927,423 A | 7/1999 | Wade et al. |
| 5,936,424 A | 8/1999 | Young et al. |
| 5,943,242 A | 8/1999 | Vorbach et al. |
| 5,956,518 A | 9/1999 | DeHon et al. |
| 6,014,509 A * | 1/2000 | Furtek et al. |
| 6,034,538 A | 3/2000 | Abramovici |
| 6,052,773 A | 4/2000 | DeHon et al. |
| 6,054,873 A | 4/2000 | Laramie |
| 6,108,760 A | 8/2000 | Mirsky et al. |
| 6,122,719 A | 9/2000 | Mirsky et al. |
| 6,127,908 A | 10/2000 | Bozler et al. |
| 6,202,182 B1 | 3/2001 | Abramovici et al. |
| 6,282,627 B1 | 8/2001 | Wong et al. |

OTHER PUBLICATIONS

Villasenor, John, et al., "Configurable Computing Solutions for Automatic Target Recognition," *IEEE*, 1996 pp. 70–79.

Tau, Edward, et al., "A First Generation DPGA Implementation," *FPD '95*, 138–143.

Athanas, Peter, et al., "IEEE Symposium on FPGAs For Custom Computing Machines," *IEEE Computer Society Press*, Apr. 19–21, 1995, pp. i–vii, 1–222.

Bittner, Ray, A., Jr., "Wormhole Run–Time Reconfiguration: Conceptualization and VLSI Design of a High Performance Computing system," *Dissertation*, Jan. 23, 1997, pp. i–xx, 1–415.

Myers, G., Advances in Computer Architecture, Wiley–Interscience Publication, 2nd ed., John Wiley & Sons, Inc. pp. 463–494, 1978.

M. Saleeba, "A Self–Contained Dynamically Reconfigurable Processor Architecture", Sixteenth Australian Computer Science Conference, ASCS–16, QLD, Australia, Feb., 1993.

M. Morris Mano, "Digital Design," by Prentice Hall, Inc., Englewood Cliffs, New Jersey 07632, 1984, pp. 119–125, 154–161.

Maxfield, C. "Logic that Mutates While–U–Wait" EDN (Bur. Ed) (USA), EDN (European Edition), Nov. 7, 1996, Cahners Publishing, USA.

Norman, Richard S., Hyperchip Business Summary, The Opportunity, Jan. 31, 2000, pp.1–3.

\* cited by examiner

I/O AND MEMORY BUS SYSTEM FOR DFPS AND UNITS WITH TWO OR MULTI-DIMENSIONAL PROGRAMMABLE CELL ARCHITECTURES This application is a continuation of International Patent Application No. PCT/DE97/03013 filed on Dec. 21, 1997 and a continuation-in-part of U.S. patent application Ser. No. 08/947,254 filed on Oct. 8, 1997, U.S Pat. No. 6,119,181.

BACKGROUND INFORMATION

DFP-Based Systems:

German Patent No. 44 16 881 describes data flow processors (DFPs) in which lines of each edge cell, i.e., a cell at the edge of a cell array often in direct contact with the terminals of the unit, lead outward via the terminals of the unit. The lines do not have any specific function. Instead, the lines assume the function that is written into the edge cells. Several DFPs may be interconnected to form a matrix by connecting all terminals.

Systems With Two- or Multi-Dimensional Programmable Cell Architectures:

In systems with two- or multi-dimensional programmable cell architectures, such as field programmable gate arrays (FPGAs) and dynamically programmable gate arrays (DPGAs), a certain subset of internal bus systems and lines of the edge cells are connected to the outside via the unit terminals. The lines do not have any specific function, and instead they assume the function written in the edge cells. If several FPGAs/DPGAs are interconnected, the terminals assume the function implemented in the hardware or software.

Problems

DFP-Based Systems:

The wiring complexity for peripherals or for interconnecting DFPs is very high, because the programmer must also ensure that the respective functions are integrated into the cells of the DFP(s). For connecting a memory, a memory management unit must be integrated into the unit. For connecting peripherals, the peripherals must be supported. Additionally, cascading of DFPs must be similarly taken into account. This is relatively complicated. Moreover, space in the unit is lost for the respective implementations.

Systems With Two- or Multi-Dimensional Programmable Cell Architectures (FPGAs, DPGAs):

The above also applies to FPGAs and DPGAs, in particular when the FPGAs and DPGAs implement algorithms or operate as arithmetic (co)processors.

SUMMARY

In accordance with an example embodiment of the present invention, the expense of wiring, in particular the number of unit terminals required, is greatly reduced. A uniform bus system operates without any special consideration by a programmer. A permanent implementation of the bus system control is provided. Memory and peripherals can be connected to the bus system without any special measures. Likewise, units can be cascaded with the help of the bus system.

According to the present invention, a general bus system is provided which combines a number of internal lines and leads them as a bundle to the terminals. The bus system control is predefined and does not require any influence by the programmer. Any number of memory devices, peripherals or other units (i.e., cascading) can be connected to the bus system.

DETAILED DESCRIPTION

Figure 1:
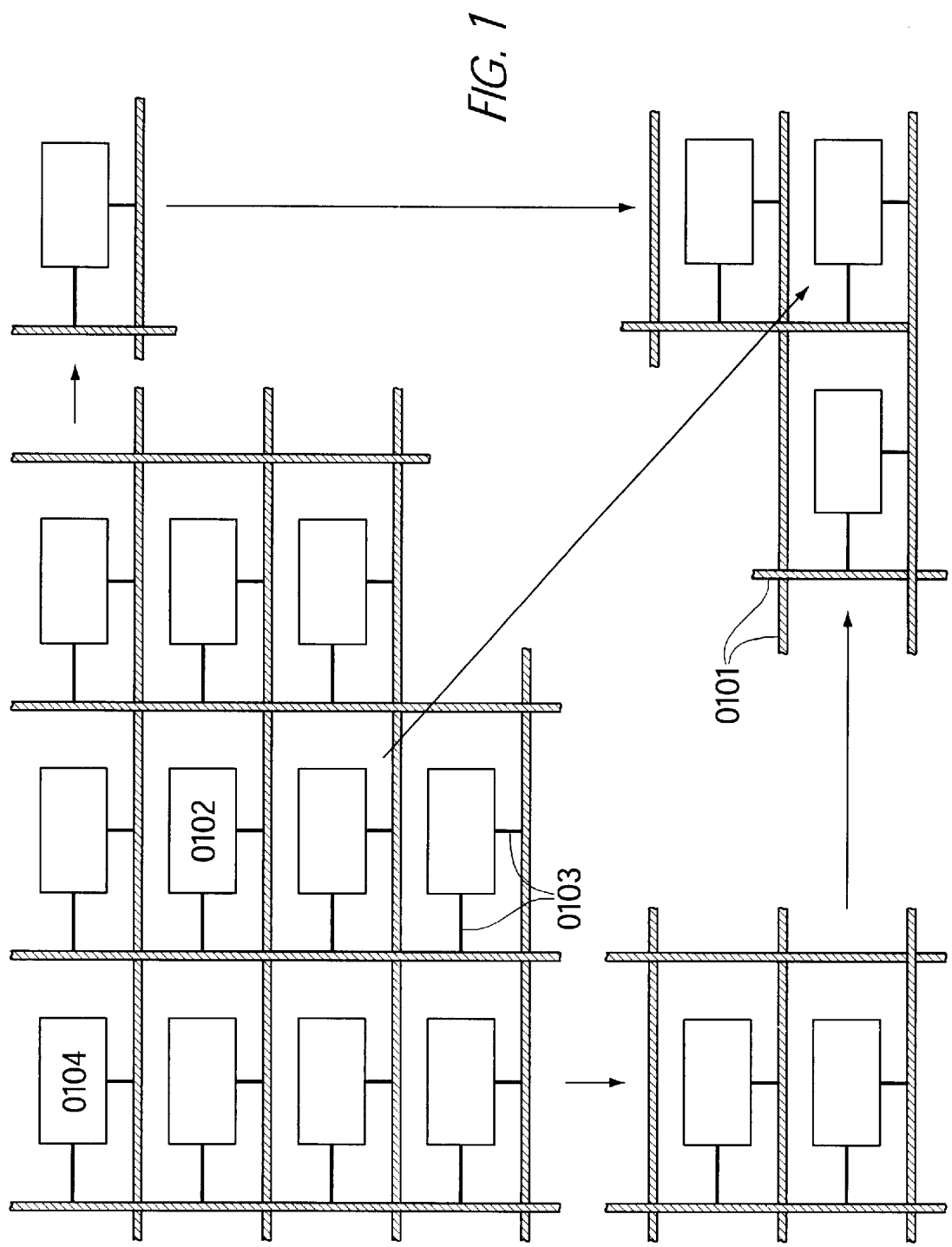
FIG. 1 shows an example of a basic unit as a type A FPGA.

The following description encompasses several architectures which are controlled and configured by a primary logic unit, such as DFPs, FPGAs, DPGAs, etc. Parts of the primary logic unit may be integrated on the unit. Alternatively, the architectures may be dynamically controlled or reconfigured directly through the unit itself (see, e.g., FIGS. 6, 7). The architectures may be implemented in a permanent form on the unit, or they may be created by configuring and possibly combining multiple logic cells, i.e., configurable cells which fulfill simple logical or arithmetic functions according to their configuration (cf. DFP, FPGA, DPGA).

Bundling Internal Lines:

In accordance with the example embodiment of the present invention, to obtain appropriate bus architectures, a plurality of internal lines are combined in buses (I-BUSn, where n denotes the number of the bus). The lines may be internal bus systems or lines of the edge cells. For write access to the external bus (E-Bus) over clocked latches or registers (I-GATE-REG), the individual buses are connected to gates that function as switches to the E-BUS. Such a unit is called an OUTPUT CELL. Access to the E-BUS takes place in such a way that the individual latches are switched via the gates to the common E-BUS. There is always only one gate open. Each I-BUSn has a unique identification number (n: e.g., I-BUS1, I-BUS976, etc.).

For read access, the incoming E-BUS is stored temporarily in clocked latches or registers (E-GATE-REG) and then distributed over the gates to the I-BUSn. Such a unit is called an INPUT CELL. Pick up from the E-BUS takes place in such a way that an E-BUS transfer is written into one or more E-GATE-REGs. The E-GATE-REGs can then be switched either individually or together to their internal bus systems.

Read-write access can take place in any order. Under some circumstances, the internal buses I-BUSn may be subdivided into two groups, e.g., writing output buses IO-BUSn and reading input buses II-BUSn.

Address Generation:

For most accesses to external units, addresses are generated for selecting a unit or parts of a unit. The addresses may be permanent, i.e., they do not change (this is the case especially with peripheral addresses) or the addresses may change by (usually) fixed values with each access (this is the case especially with memory addresses). For generating the addresses, there are programmable counters for read access and programmable counters for write access. The counters are set at a base value by the PLU, which is the unit that configures the configurable units (DFPs, FPGAs, DPGAs, etc.) based on cell architecture. With each access to the gate, the counter is incremented or decremented by a value defined by the PLU, depending on the setting. Likewise, each counter can also be used as a register, which means that counting is not performed with each access, and the value set in the counter is unchanged. The value of the counter belonging to the gate is assigned as an address to each bus transfer. The counter is set by a setting register (MODE PLUREG) to which the PLU has write access.

Masks and States:

Each gate is assigned a number of bits in MODE PLUREG (described below). The bits indicate whether the gate is active or is skipped by the controller, i.e., is masked out (MASK). If a gate is masked out, the gate is skipped in running through all gates to connect to the respective bus system.

The following mask records are examples of possible mask records:
- always skip the INPUT/OUTPUT CELL,
- skip the INPUT/OUTPUT CELL only in writing,
- skip the INPUT/OUTPUT CELL only in reading if the E-BUS MASTER has not accessed the INPUT/OUTPUT CELL,
- never skip the INPUT/OUTPUT CELL.

Each gate is assigned a state register which may be designed as an RS flip-flop. This register indicates whether data have been written into the register belonging to the gate.

MODE PLUREG

The MODE PLUREG can be written and read by the PLU. It serves to set the bus system.

One possible MODE PLUREG architecture from the standpoint of PLU is set forth below:

| Bit 1-m | Bit k-1 | Bit 2-k | Bit 1 | Bit 0 |
|---|---|---|---|---|
| Mask | Predefined value | Step length | 0 = additive counting<br>1 = subtractive counting | 0 = register<br>1 = counter |
| Masking | | | Settings for address generator | |

Description of the INPUT CELL:

A distinction is made according to whether data is transmitted from the E-BUS to the unit (the component used for this is called the INPUT CELL) or whether data is transmitted from the unit to the E-BUS (the component used for this is called an OUTPUT CELL).

An example embodiment of the INPUT CELL is as follows. A latch (I-GATE-REG) which is controlled either by the external E-BUS MASTER or the internal state machine serves as a buffer for the data received from the E-BUS. The clock pulse of the latch is sent to (for example) an RS flip-flop (SET-REG) which retains access to the I-GATE-REG. Downstream from the I-GATE-REG is a gate (I-GATE) which is controlled by the state machine. The data goes from the I-GATE-REG to the I(I)-BUSn via the I-GATE.

In addition the example embodiment, there is a programmable incrementer/decrementer in the INPUT CELL. The programmable incrementer/decrementer can be controlled by the state machine after each active read access to the E-BUS to increment or decrement an adjustable value. It can also serve as a simple register. This counter generates the addresses for bus access where the unit is E-BUS MASTER. The addresses are sent to the E-BUS via a gate (ADR-GATE). The ADR-REG is controlled by the state machine.

The E-BUS MASTER can poll the state of the SET-REG via another gate (STATE-GATE). Each INPUT CELL has a MODE PLUREG in which the PLU configures the counter and turns the INPUT CELL on or off (masks it).

Description of the OUTPUT CELL:

An example embodiment of an OUTPUT CELL is as follows. A latch (E-GATE-REG) which is controlled by the internal state machine provides buffer storage for the data obtained from the I-BUS.

In addition, a programmable incrementer/decrementer is provided in the OUTPUT CELL. The clock signal of the latch is sent to (for example) an RS flip-flop (SET-REG) which retains access to the E-GATE-REG. The programmable incrementer/decrementer can be controlled by the state machine after each read access to the E-BUS to increment or decrement an selectable value. It can also function as a simple register. This counter generates the addresses for bus access in which the unit is E-BUS MASTER.

The data of the E-GATE-REG, the addresses and the state of the SET-REG are sent to the E-BUS via a gate (E-GATE) which is controlled either by the external E-BUS MASTER or the internal state machine. Each OUTPUT CELL has a MODE PLUREG in which the PLU configures the counter and turns the OUTPUT CELL on and off (masks it).

Controlling the Bus System:

At a higher level than the individual gates, address generators and masks, in the example embodiment of the present invention, there is a controller consisting of a simple, conventional state machine. Two operating modes are differentiated:

1. An active mode in which the state machine controls the internal bus (I-BUS) and the external bus (E-BUS). This mode is called E-BUS MASTER because the state machine has control of the E-BUS.

2. A passive mode in which the state machine controls only the internal bus (I-BUS). The E-BUS is controlled by another external unit. The state machine reacts in this mode to the requirements of the external E-BUS MASTER. This mode of operation is called E-BUS SLAVE.

The controller manages the E-BUS protocol. The sequence differs according to whether the controller is functioning in E-BUS MASTER or E-BUS SLAVE mode. A particular protocol is not described herein, because any one of a number of conventional protocols may be implemented.

E-BUS MASTER and E-BUS SLAVE, EB-REG:

In the example embodiment, the E-BUS control register (EB-REG) is provided to manage the data traffic on the E-BUS. The E-BUS control register is connected in series with the gates and can be addressed and operated from the E-BUS. The data exchange may be regulated through the following records:

I-WRITE: indicates that the I-BUS is written completely into the INPUT/OUTPUT CELLs, I-READ: indicates that the I-BUS has completely read the INPUT/OUTPUT CELLs, E-WRITE: indicates that the E-BUS has been written completely into the INPUT/OUTPUT CELLs, E-READ: indicates that the E-BUS has completely read the INPUT/OUTPUT CELLs.

In the example embodiment, the EB-REG is always active only on the side of the E-BUS SLAVE, and the E-BUS MASTER has read-write access to it.

All I-... records are written by E-BUS SLAVE and read by E-BUS MASTER.

All E-... records are written by E-BUS MASTER and read by E-BUS SLAVE.

An E-BUS SLAVE can request control of the E-BUS by setting the REQ MASTER bit in its EB-REG. If the E-BUS MASTER recognizes the REQ MASTER bit, it relinquishes the bus control as soon as possible. The E-BUS MASTER relinquishes the bus control by setting the MASTER bit in the EB-REG of an E-BUS SLAVE. The E-BUS MASTER then immediately switches the E-BUS to passive mode. The old E-BUS SLAVE becomes the new E-BUS MASTER, and the old E-BUS MASTER becomes the new E-BUS SLAVE. The new E-BUS MASTER assumes control of the E-BUS. To recognize the first E-BUS MASTER after a RESET of the system, there is a terminal on each unit which indicates by the preset polarity whether the unit is E-BUS MASTER or E-BUS SLAVE after a RESET. The MASTER record in the EB-REG can also be set and reset by the PLU. In the example embodiment, the PLU must be sure that there are no bus collisions on the EB-BUS and that no ongoing transfers are interrupted.

E-BUS MASTER writes data to E-BUS SLAVE In the example embodiment of the present invention, the E-BUS MASTER can write data to the E-BUS SLAVE as follows:

The data transfer begins when the state machine of the E-BUS MASTER selects an OUTPUT CELL that is not masked out.

Data has already been stored in the I-GATE REG, depending on the design of the state machine, or the data is stored now.

The gate is activated.

The valid read address is transferred to the bus.

The data goes to the E-BUS and is stored in the E-GATE REG of the E-BUS SLAVE.

The SET-REG in the E-BUS SLAVE is thus activated.

The gate in the E-BUS MASTER is deactivated.

The address counter generates the address for the next access.

The transfer is terminated for the E-BUS MASTER.

There are two possible embodiments of the E-BUS SLAVE for transferring data from the bus to the unit:

1. The data gate is always open and the data goes directly from the E-GATE-REG to the I-BUSn.

2. The state machine recognizes that SET-REG is activated, and it activates the gate, so that SET-REG can be reset.

The E-BUS MASTER can notify the E-BUS SLAVE when a complete bus cycle is terminated (a bus cycle is defined as the transfer of multiple data strings to different E-GATE-REGs, where each E-GATE-REG may be addressed exactly once).

The E-BUS MASTER sets the E-WRITE bit in the EB-REG of the E-BUS SLAVE at the end of a bus cycle.

The E-BUS SLAVE can respond by polling the INPUT CELLs.

When it has polled all the INPUT CELLs, it sets the I-READ bit in its EB-REG.

It then resets E-WRITE and all the SET-REGs of the INPUT CELLS.

The E-BUS MASTER can poll I-READ and begin a new bus cycle after its activation.

I-READ is reset by E-WRITE being written or the first bus transfer.

The E-BUS SLAVE can analyze whether the INPUT CELLs can/must be read again on the basis of the status of the EB-REG or the individual SET-REGs of the INPUT CELLs.

E-BUS MASTER reads data from E-BUS SLAVE: From the standpoint of the E-BUS MASTER, there are two basic methods of reading data from the E-BUS SLAVE:

1. Method in which the E-BUS data goes directly to the I-BUS:

The data transfer begins with the state machine of the E-BUS MASTER selecting an INPUT CELL which is not masked out.

The I-GATE and the ADR-GATE are activated.

The valid read address is transferred to the bus.

The I-GATE-REG is transparent, i.e., it allows the data through to the I-BUSn.

The gate in the E-BUS MASTER is deactivated.

The address counter generates the address for the next access.

The transfer is terminated for the E-BUS MASTER.

2. Method in which the E-BUS data is stored temporarily in the I-GATE-REG:

The data transfer begins with the state machine of the E-BUS MASTER selecting an INPUT CELL which is not masked out.

The I-GATE and the ADR-GATE are activated.

The valid read address is transferred to the bus.

I-GATE-REG stores the data.

The gate in the E-BUS MASTER is deactivated.

The address counter generates the address for the next access.

The E-BUS transfer is terminated for the E-BUS MASTER.

All INPUT CELLS involved in the E-BUS transfer, which can be ascertained on the basis of the masks in the MODE PLUREG or the state of the SET-REG, are run through and the data is transferred to the respective I-BUS.

For the E-BUS SLAVE, the access looks as follows:

The gate is activated by the E-BUS.

The data and the state of any SET-REG that may be present go to the E-BUS.

The gate is deactivated.

The E-BUS MASTER can notify the E-BUS SLAVE when a complete bus cycle is terminated.

To do so, at the end of a bus cycle, the E-BUS MASTER sets the E-READ bit in the EB-REG of the E-BUS SLAVE.

E-BUS SLAVE can react by writing to the OUTPUT CELLs anew.

When it has written to all the OUTPUT CELLs, it sets the I-WRITE bit in its EB-REG.

In doing so, it resets E-READ and all the SET-REGs of the OUTPUT CELLS.

The E-BUS MASTER can poll I-WRITE and begin a new bus cycle after its activation.

I-WRITE is reset by writing E-READ or the first bus transfer.

E-BUS SLAVE can evaluate on the basis of the state of the EB-REG or the individual SET-REGs of the OUTPUT CELLS whether the OUTPUT CELLs can/must be written anew.

Connection of Memory Devices and Peripherals, Cascading:

In addition to cascading identical units (DFPs, FPGAs, DPGAs), memories and peripherals can also be connected as lower-level SLAVE units (SLAVE) to the bus system described here. Memories and peripherals as well as other units (DFPs, FPGAs) can be combined here. Each connected SLAVE analyzes the addresses on the bus and recognizes independently whether it has been addressed. In these modes, the unit addressing the memory or the peripheral, i.e., the SLAVE units, is the bus MASTER (MASTER), i.e., the unit controls the bus and the data transfer. The exception is intelligent peripheral units, such as SCSI controllers that can initiate and execute transfers independently and therefore are E-BUS MASTERs.

Through the method described here, bus systems can be connected easily and efficiently to DFPs and FPGAs. Both memories and peripherals as well as other units of the types mentioned above can be connected over the bus systems.

The bus system need not be implemented exclusively in DFPs, FPGAs and DPGAs. Hybrid operation of this bus system with traditional unit terminal architectures is of course possible. Thus the advantages of the respective technique can be utilized optimally.

Other sequencing methods are also possible for the bus system described here. However, they will not be detailed here because they are free embodiment options that do not depend on the basic principle described here.

Description Of The Figures:

FIG. 1 shows a conventional FPGA, where 0101 represents the internal bus systems, 0102 includes one or more FPGA cells. 0103 denotes subbuses which are a subset of 0101 and are connected to 0101 via switches (crossbars). 0103 can also manage internal data of 0102 that are not switched to 0101. The FPGA cells are arranged in a two-dimensional array. 0104 is an edge cell located at the edge of the array and is thus in direct proximity to the terminals at the edge of the unit.

Figure 2:
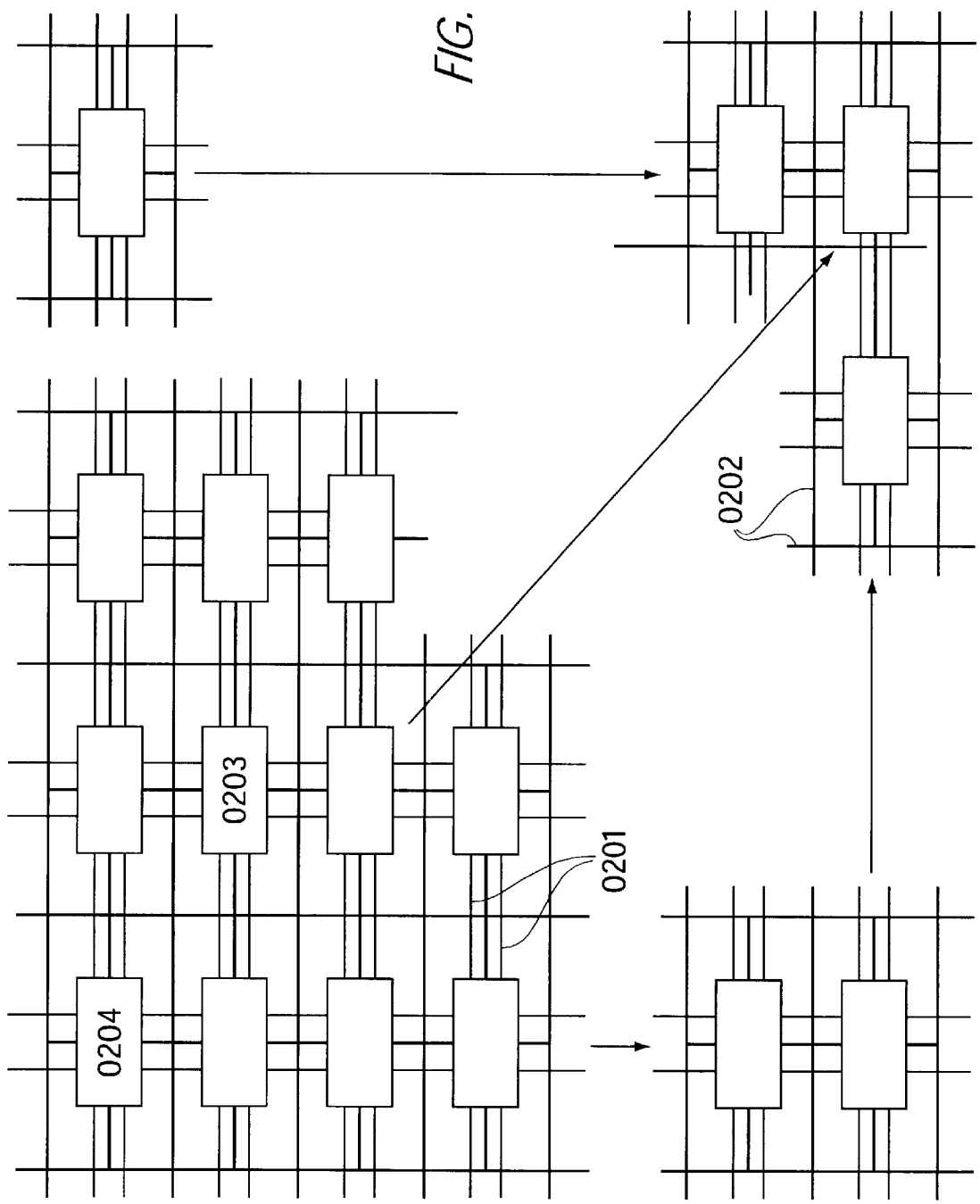
FIG. 2 shows an example of a basic unit as a type B FPGA.

FIG. 2 shows another conventional FPGA. This embodiment does not work with bus systems like 0101 but instead mainly with next-neighbor connections (0201), which are direct connections from an FPGA cell (0203) to a neighboring cell. There may be global bus systems (0202) nevertheless, although they are not very wide. The FPGA cells or a group of FPGA cells have a connection to 0202. The FPGA cells are arranged in a two-dimensional array. 0204 is an edge cell located at the edge of the array and thus in close proximity to the terminals at the edge of the unit.

Figure 3:
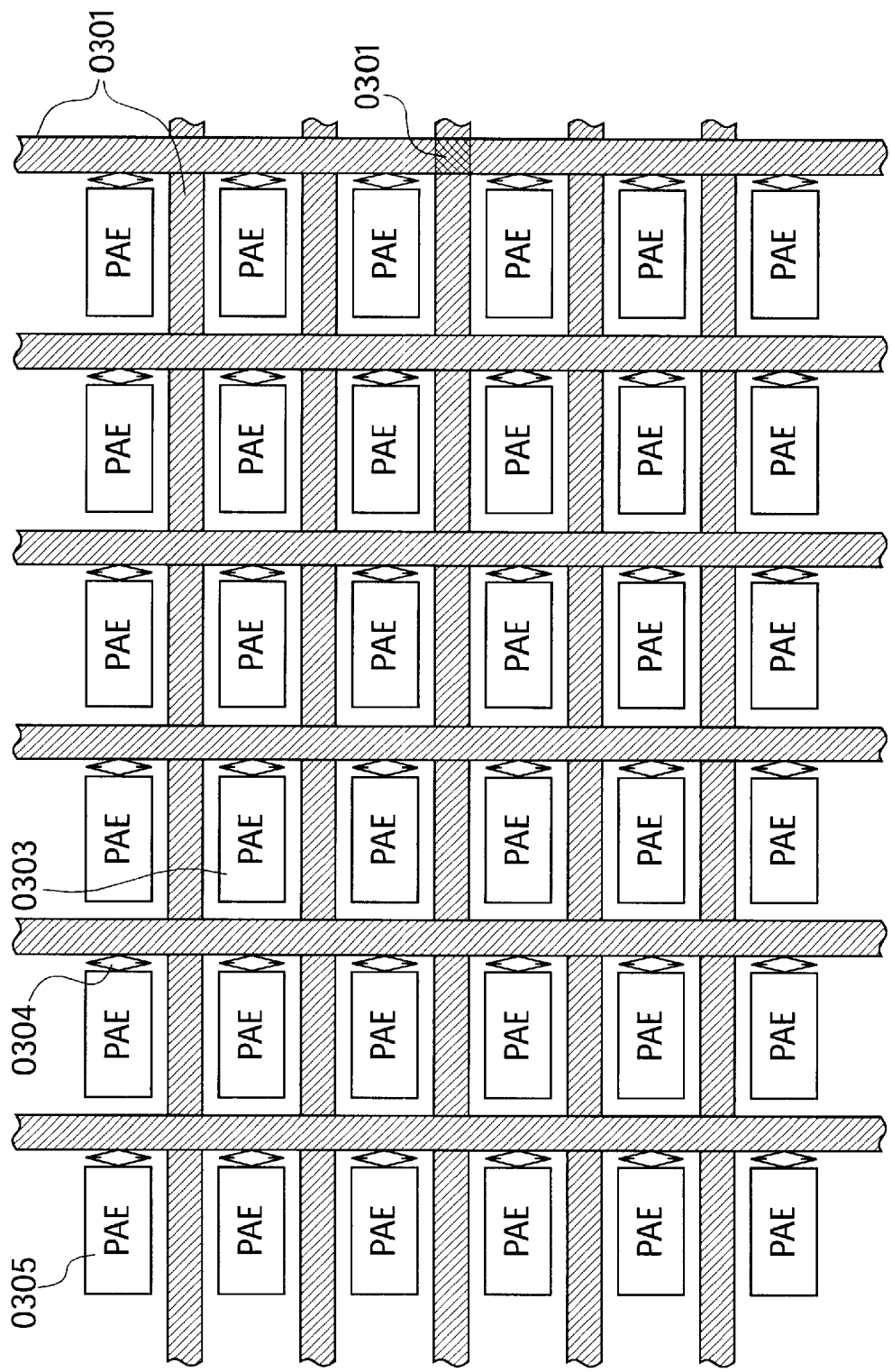
FIG. 3 shows an example of a basic unit as a DFP.

FIG. 3 shows a DFP described in, for example, German Patent No. 196 51 075.9. The PAE cells (0303) are wired to the bus systems (0301) via a bus interface (0304). Bus systems 0301 can be wired together via a bus switch (0302). The PAE cells are arranged in a two-dimensional array. 0305 is an edge cell located on the edge of the array and is thus in close proximity to the terminals at the edge of the unit.

Figure 4B:
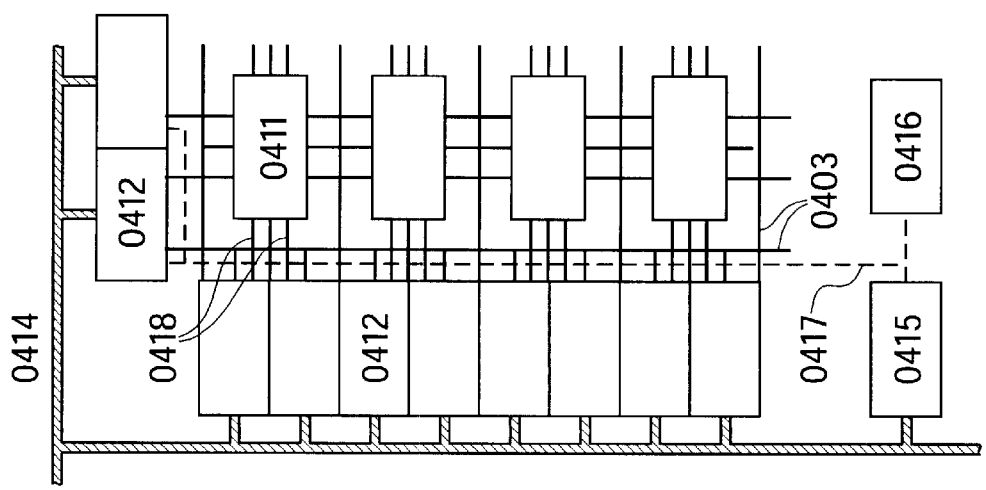
FIG. 4b shows an example of line bundling in FPGAs according to another example embodiment of the present invention.
Figure 4A:
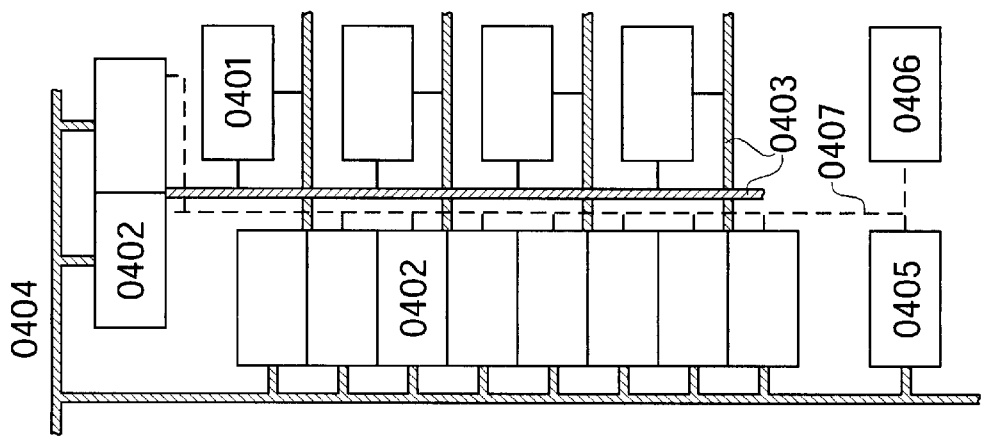
FIG. 4a shows an example of line bundling in FPGAs according to an example embodiment of the present invention.

FIG. 4a shows an FPGA edge according to FIG. 1. Outside the edge cells (0401) there are arranged a plurality of INPUT/OUTPUT CELLs (0402) connecting the internal bus systems (0403) individually or in groups to the E-BUS (0404). The number of INPUT/OUTPUT CELLs depends on their own width in relation to the width of the internal bus systems. 0405 is an EB-REG. 0406 is a state machine. A bus system (0407) by means of which the state machine controls the INPUT/OUTPUT CELLs runs from the state machine to the EB-REG and each individual INPUT/OUTPUT CELL. There may be several 0405s and 0406s by combining a number of 0402s into groups, each managed by a 0405 and 0406.

FIG. 4b shows an FPGA edge according to FIG. 2. Several INPUT/OUTPUT CELLs (0412) are arranged outside the edge cells (0411) and are connected individually or in groups to the E-BUS (0414) via the internal bus systems (0413) and the direct connections of the edge cells (0417). The number of INPUT/OUTPUT CELLs depends on their own width in relation to the width of the internal bus systems (0413) and the number of direct connections (0418). 0415 is an EB-REG. 0416 is a state machine. A bus system (0417) by means of which the state machine controls the INPUT/OUTPUT CELLs goes from the state machine to the EB-REG and each individual INPUT/OUTPUT CELL. There may be multiple 0415s and 0416s by combining a number of 0412s into groups, each managed by a 0415 and 0416.

Figure 5:
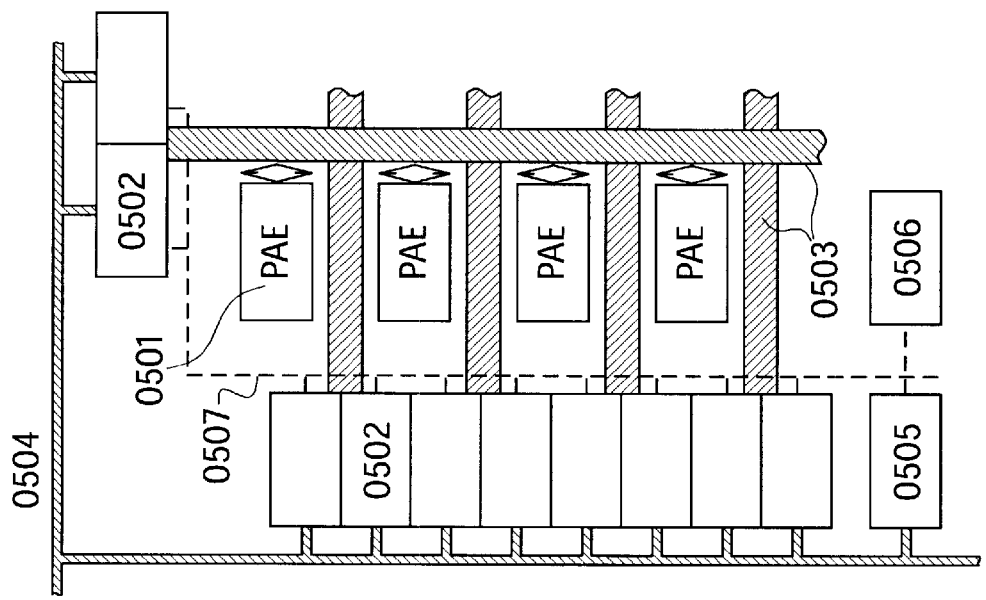
FIG. 5 shows an example of line bundling in DFPs according to an example embodiment of the present invention.

FIG. 5 shows a DFP edge according to FIG. 3. Outside the edge cells (0501) are arranged several INPUT/OUTPUT CELLs (0502) which are connected individually or in groups to the E-BUS (0504) by the internal bus systems (0503). The number of INPUT/OUTPUT CELLs depends on their own width in relation to the width of the internal bus systems (0503). 0505 is an EB-REG. 0506 is a state machine. The state machine controls the INPUT/OUTPUT CELLs via a bus system (0507) which goes from the state machine to the EB-REG and each individual INPUT/OUTPUT CELL. There may be multiple 0505s and 0506s by combining a number of 0412s into groups, each managed by a 0505 and 0506.

Figure 6:
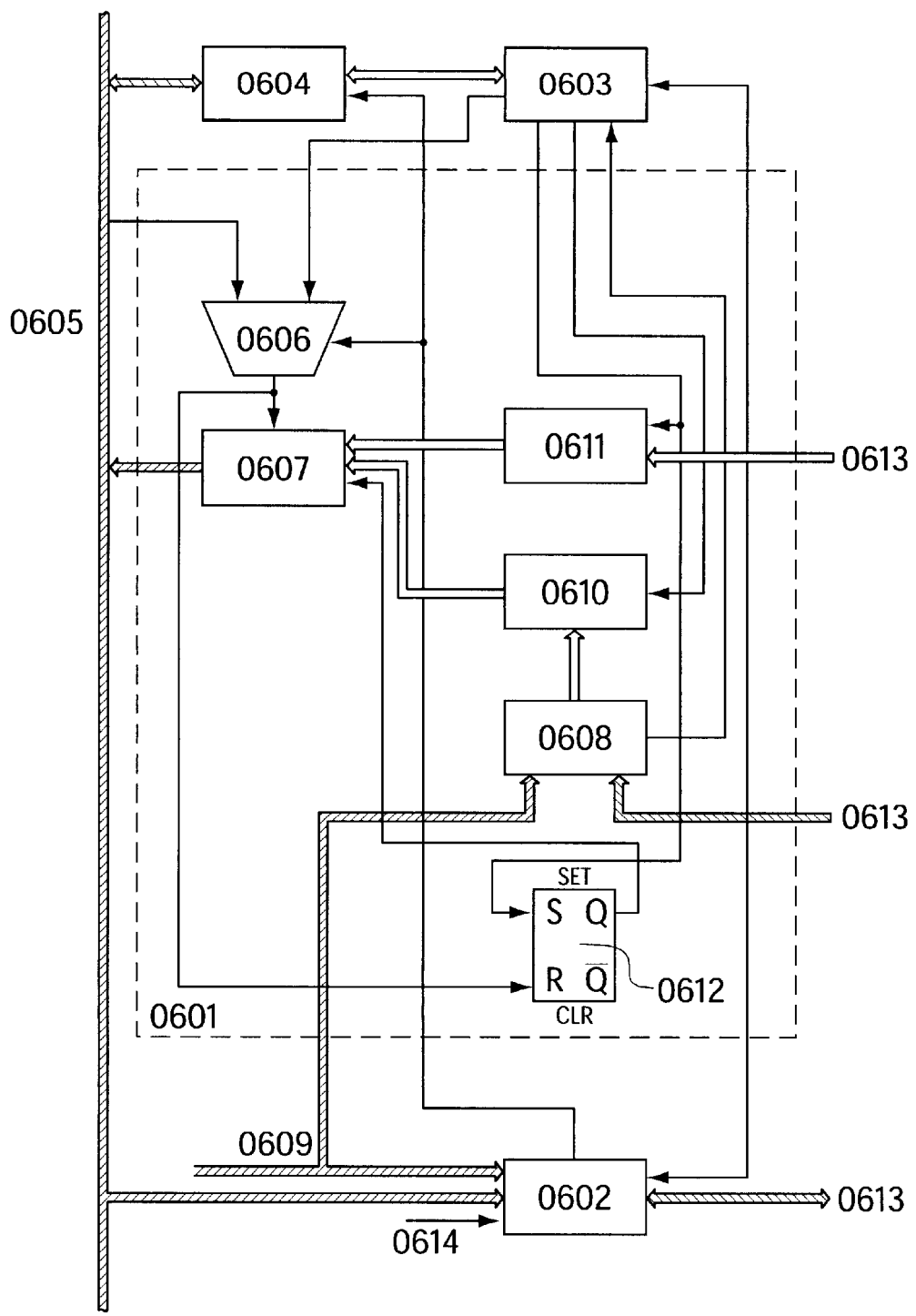
FIG. 6 shows an example of an OUTPUT CELL according to an example embodiment of the present invention.

FIG. 6 shows an OUTPUT CELL 0601. Outside of 0601 there are the EB-REG (0602) and the state machine (0603) plus a gate (0604) which connects the state machine to the E-BUS (0605) if it is the E-BUS MASTER. Access to the EB-REG is possible via the E-BUS (0605), the I-BUS (0613) and the PLU bus (0609). In addition, when the unit is reset, the MASTER bit can be set via an external terminal (0614) leading out of the unit. The state machine (0603) has read-write access to 0602. In the OUTPUT CELL there is a multiplexer (0606) which assigns control of the E-GATE (0607) to either the E-BUS MASTER or the state machine (0603). The MODE PLUREG (0608) is set via the PLU bus (0609) or the I-BUS (0613) and it configures the address counter (0610) and the state machine (e.g., masking out the OUTPUT CELL). If data of the I-BUS (0613) is stored in the I-GATE-REG (0611), the access is noted in SET-REG (0612). The state of 0612 can be polled via 0607 on the E-BUS. Read access (E-GATE 0607 is activated) resets 0612. The addresses generated by 0610 and the data of 0611 are transferred to the E-BUS via gate 0607. There is the possibility of dynamically reconfiguring and controlling the OUTPUT CELL via the unit itself (DFP, FPGA, DPGA, etc.) rather than through the PLU. The I-BUS connection to the EB-REG (0602) and MODE PLUREG (0608) serves this function.

Figure 7:
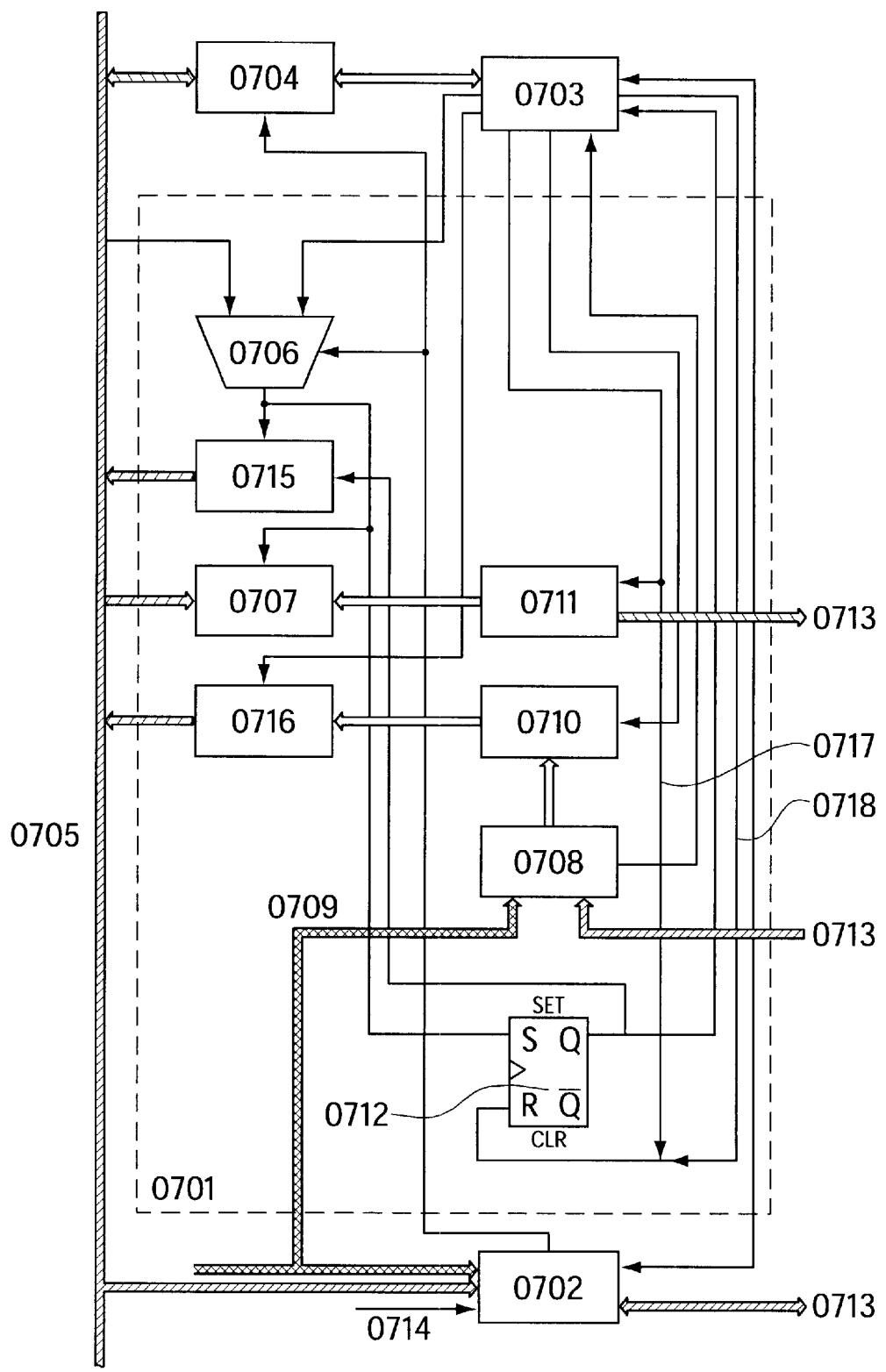
FIG. 7 shows an example of an INPUT CELL according to an example embodiment of the present invention.

FIG. 7 shows an INPUT CELL 0701. Outside of 0701 there are the EB-REG (0702) and the state machine (0703), as well as a gate (MASTER GATE) (0704) which connects the state machine to the E-BUS (0705) if it is in the E-BUS MASTER mode. Access to EB-REG is possible via the E-BUS (0705), the I-BUS (0713) and the PLU bus (0709). Furthermore, when the unit is reset, the MASTER bit can be set via an external terminal (0714) leading out of the unit. The state machine (0703) has read-write access to 0702. In the INPUT CELL there is a multiplexer (0706) which assigns control of the E-GATE-REG (0707) to either the E-BUS MASTER or the state machine (0703). The MODE PLUREG (0708) is set via the PLU bus (0709) or the I-BUS (0713) and configures the address counter (0710) and the state machine (e.g., masking out the INPUT CELL). If data of the E-BUS (0705) is stored in the E-GATE-REG (0707), this access is noted in the SET-REG (0712). The state of 0712 can be polled on the E-BUS via a gate (0715) whose control is the same as that of the latch (0707). A read access—E-GATE 0711 is activated and the data goes to the I-BUS (0713)—resets 0712 via 0717. As an alternative, 0712 can be reset (0718) via the state machine (0703).

The addresses generated by 0710 are transferred via the gate (ADR-GATE) 0716 to the E-BUS. 0716 is activated by the state machine (0703) when it is the E-BUS MASTER. There is the possibility of dynamically reconfiguring and controlling the INPUT CELL via the unit itself (DFP, FPGA, DPGA, etc.) instead of through the PLU. The I-BUS connection to the EB-REG (0702) and the MODE PLUREG (0708) serves this function.

Figure 8:
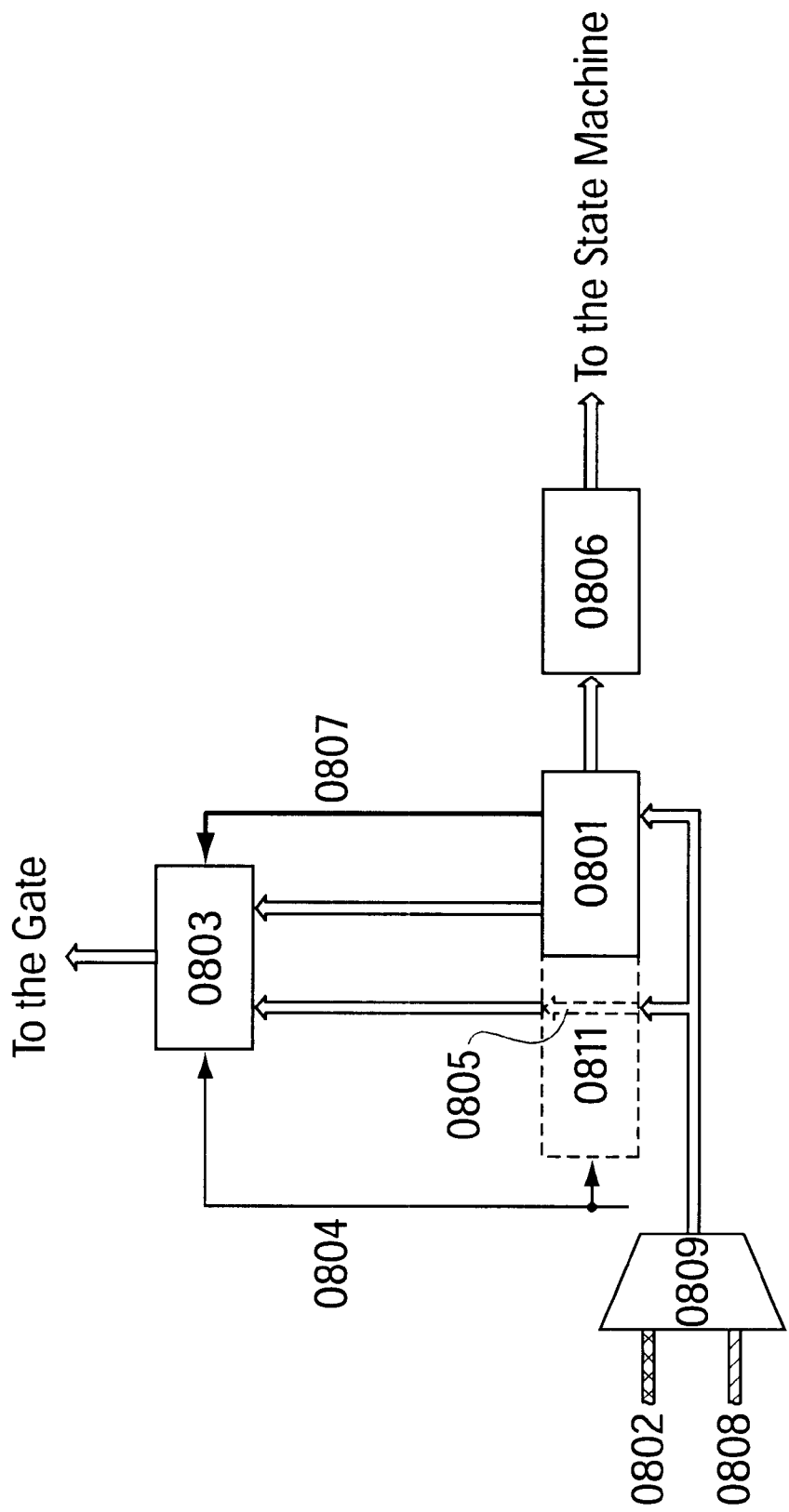
FIG. 8 shows an example of address generation in accordance with an example embodiment of the present invention.

FIG. 8 shows the MODE PLUREG (0801) of an INPUT or OUTPUT CELL written by the PLU via the PLU bus (0802) or via an I-BUS (0808). The respective bus system is selected by the multiplexer (0809) (control of the multiplexer is not shown because an ordinary decoder logic can be used). The counter settings such as step length, counting direction and enabling of the counter are sent directly (0807) to the counter (0803). The basic address can either be written directly (0805) to the counter via a load (0804) or stored temporarily in an extension (0811) of 0801. Records in 0801 that are relevant for the state machine go to the state machine via a gate (0806) which is opened by the state machine for the INPUT or OUTPUT CELL activated at the time.

Figure 9B:
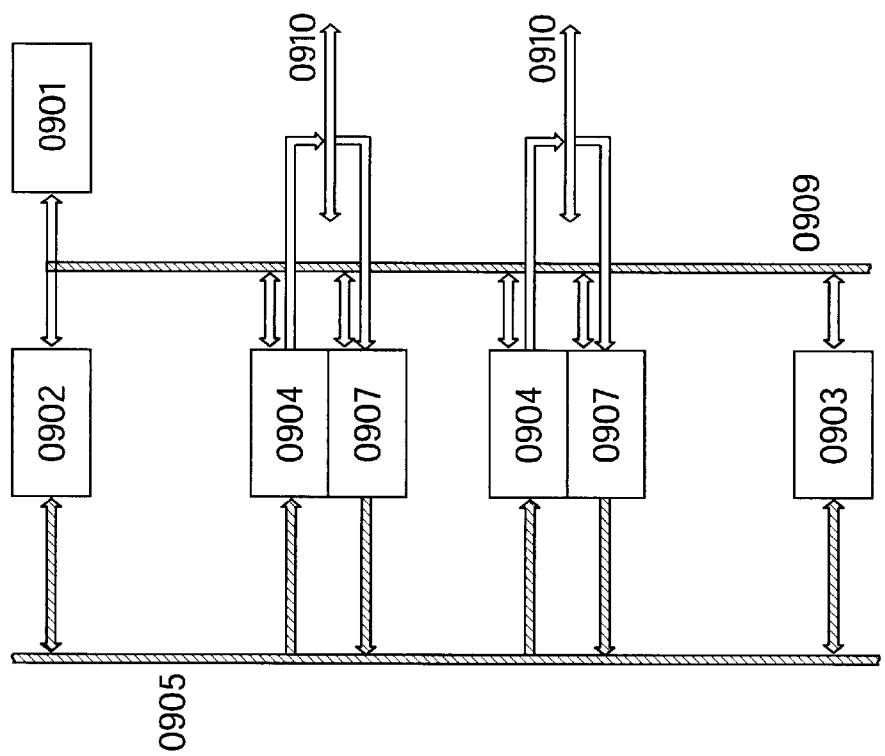
FIG. 9b shows an example of a complete bus system with controller according to another example embodiment of the present invention.
Figure 9A:
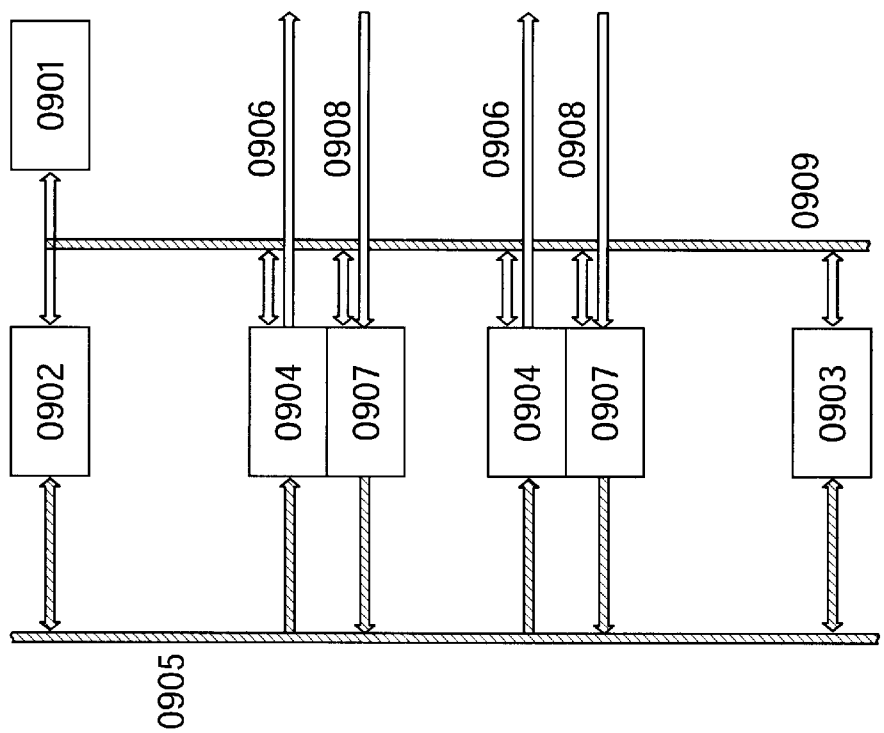
FIG. 9a shows an example of a complete bus system with controller according to an example embodiment of the present invention.

FIG. 9a shows a bus interface circuit with a state machine (0901), MASTER GATE (0902) and EB-REG (0903). INPUT CELLs (0904) transfer data from the E-BUS (0905) to the II-BUS (0906). OUTPUT CELLs (0907) transfer data from the IO-BUS (0908) to the E-BUS (0905). All units are linked together by the control bus (0909).

FIG. 9b shows a bus interface circuit with a state machine (0901), MASTER GATE (0902) and EB-REG (0903). INPUT CELLs (0904) transfer data from the E-BUS (0905) to the bidirectional I-BUS (0910). OUTPUT CELLS (0907) transfer data from the bidirectional I-BUS (0910) to the E-BUS (0905). All units are linked together over the control bus (0909). Interface circuits utilizing both possibilities (FIGS. 9a and 9b) in a hybrid design are also conceivable.

Figure 10A:
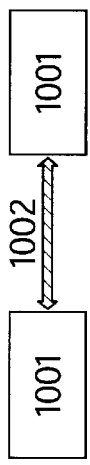
FIG. 10a shows an example of a connection of units according to the present invention.

FIG. 10a shows the interconnection of two units (DFPs, FPGAs, DPGAs, etc.) (1001) linked together via the E-BUS (1002).

Figure 10B:
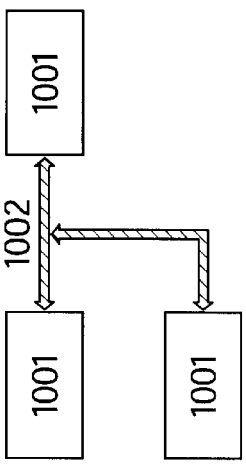
FIG. 10b shows a second example of a connection of units according to the present invention.

FIG. 10b shows the interconnection of a number of units (DFPs, FPGAs, DPGAs, etc.) (1001) via the E-BUS (1002).

Figure 10C:
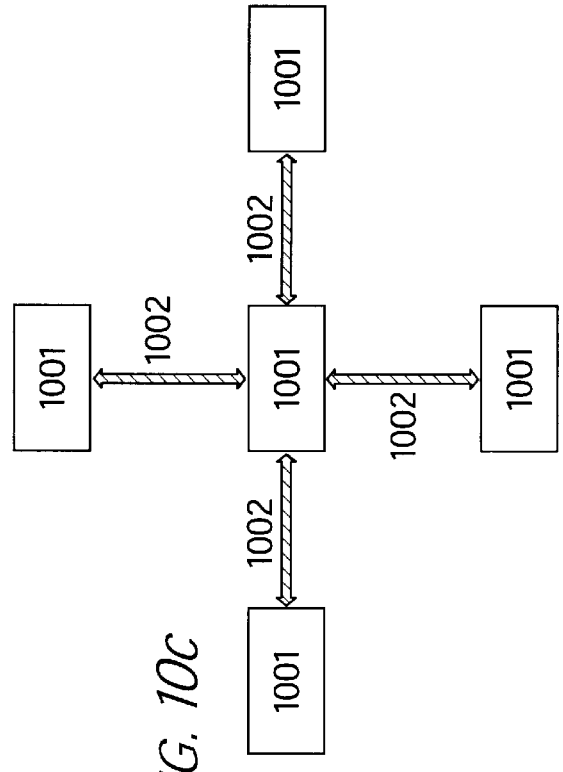
FIG. 10c shows a third example of a connection of units according to the present invention.
Figure 10D:
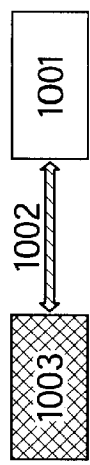
FIG. 10d shows an example of a connection of a memory and a unit according to the present invention.

FIG. 10c shows the interconnection of a number of units (DFPs, FPGAs, DPGAs, etc.) (1001) via the E-BUS (1002). This interconnection can be expanded to a matrix. One unit (1001) may also manage multiple bus systems (1002). FIG. 10d shows the interconnection of a unit (DFP, FPGA, DPGA, etc.) (1001) to a memory unit or a memory bank (1003) via the E-BUS (1002).

Figure 10E:
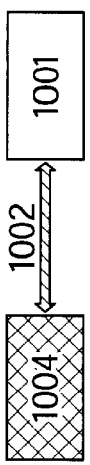
FIG. 10e shows an example of a connection of a peripheral device and a unit according to the present invention.

FIG. 10e shows the interconnection of a unit (DFP, FPGA, DPGA, etc.) (1001) to a peripheral device or a peripheral group (1004) via the E-BUS (1002).

Figure 10F:
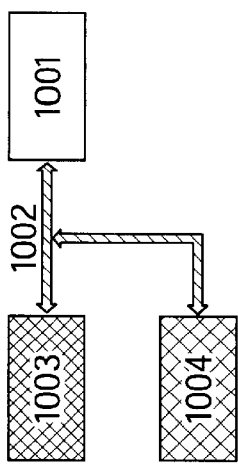
FIG. 10f shows an example of a connection of a peripheral device, a memory and a unit according to the present invention.

FIG. 10f shows the interconnection of a unit (DFP, FPGA, DPGA, etc.) (1001) to a memory unit or a memory bank (1003) and to a peripheral device or a peripheral group (1004) via the E-BUS (1002).

Figure 10G:
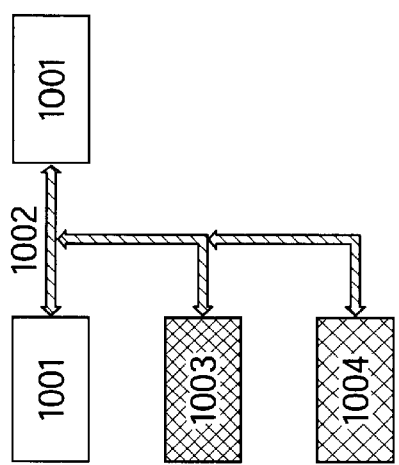
FIG. 10g shows an example of a connection of a peripheral device, a memory and units according to the present invention.

FIG. 10g shows the interconnection of a unit (DFP, FPGA, DPGA, etc.) (1001) to a memory unit or a memory bank (1003) and to a peripheral device or a peripheral group (1004) plus another unit (DFP, FPGA, DPGA, etc.) (1001) via the E-BUS (1002).

Figure 11:
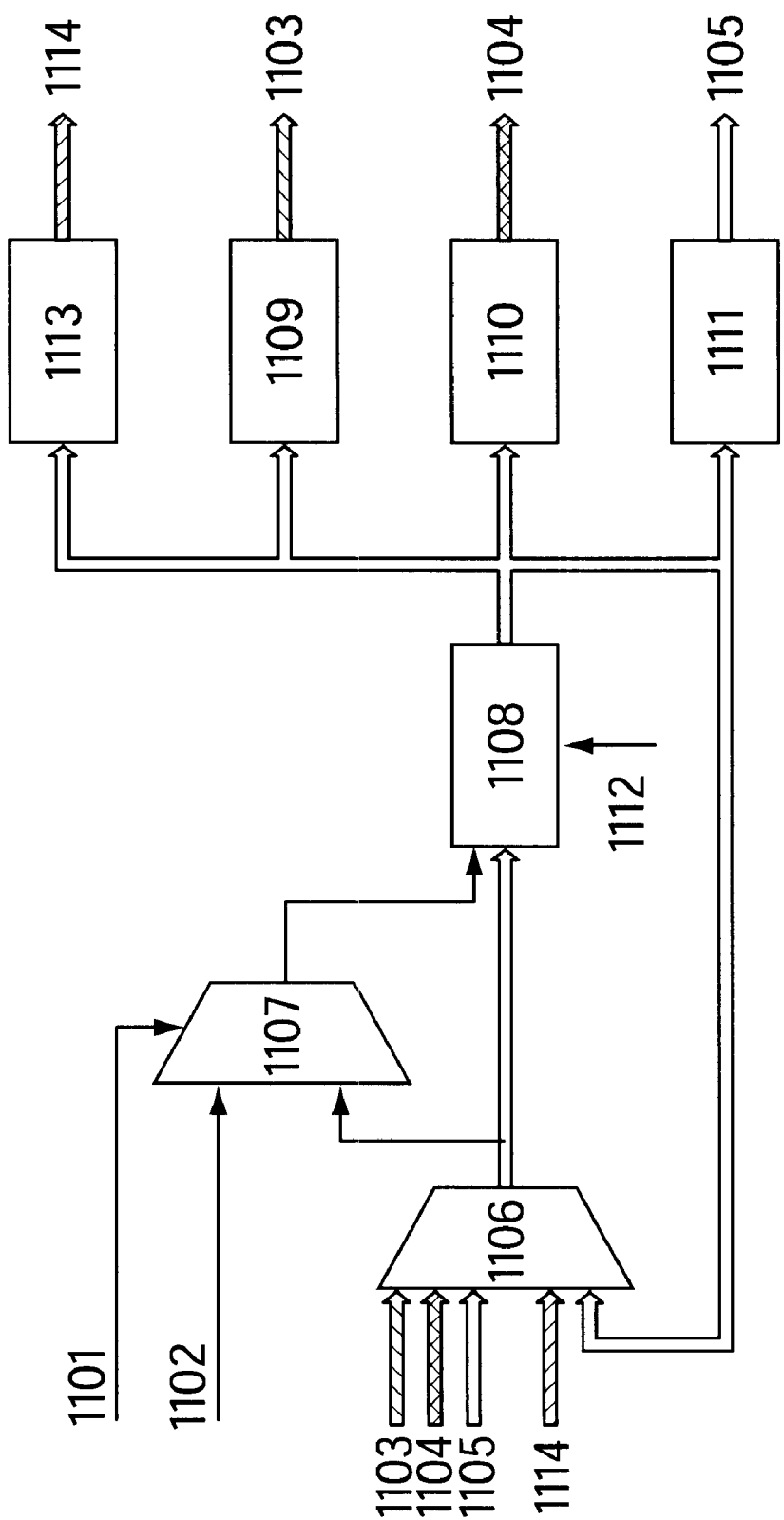
FIG. 11 shows an example of an EB-REG in accordance with an example embodiment of the present invention.

FIG. 11 shows the architecture of the EB-REG. The bus systems E-BUS (1103), the PLU bus (1104) over which the PLU has access to the EB-REG, and the local internal bus between the INPUT/OUTPUT CELLs, the state machine and the EB-REG (1105, see 0407, 0417, 0517) and possibly an I-BUS (1114) are connected to a multiplexer (1106). The multiplexer (1106) selects either one of the buses or feedback to the register (1108) and switches the data through to the input of the register (1108). The MASTER bit is sent to the register (1108) separately over the multiplexer (1107). The multiplexer is controlled by the RESET signal (1101) (resetting or initializing the unit). If a RESET signal is applied, the multiplexer (1107) switches the signal of an external chip connection (1102) through to the input of the register (1108); otherwise the output of the multiplexer (1106) is switched through to the input of the register (1108). MASTER may thus be pre-allocated. The register (1108) is clocked by the system clock (1112). The contents of the register (1108) are switched via a gate (1109, 1110, 1111, 1113) to the respective bus system (1103, 1104, 1105, 1114) having read access at that time. Control of the gates (1109, 1110, 1111, 1113) and of the multiplexer (1106) is not shown because an ordinary decoder logic may be used.

Embodiments

Figure 12:
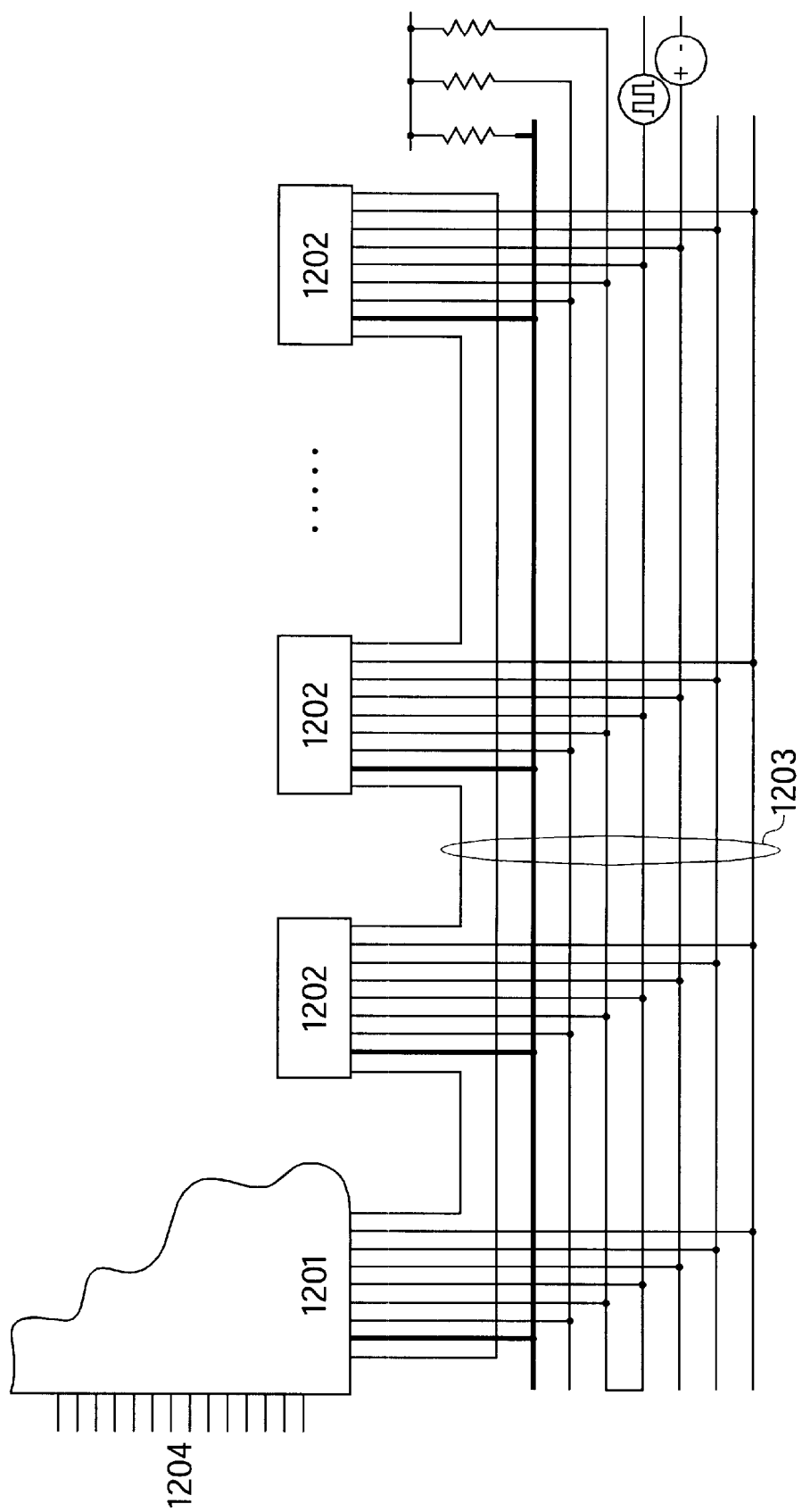
FIG. 12 shows an example embodiment of the present invention using a RAMBUS.

FIG. 12 shows an example embodiment using a standard bus system RAMBUS (1203). One unit (DFP, FPGA, DPGA, etc.) (1201) is connected to other units (memories, peripherals, other DFPs,. FPGAs, DPGAs, etc.) (1202) by the bus system (1203). Independently of the bus system (1203), this unit (1201) may have additional connecting lines (1204), e.g., for connecting any desired circuits, as is customary in the related art.

Figure 13:
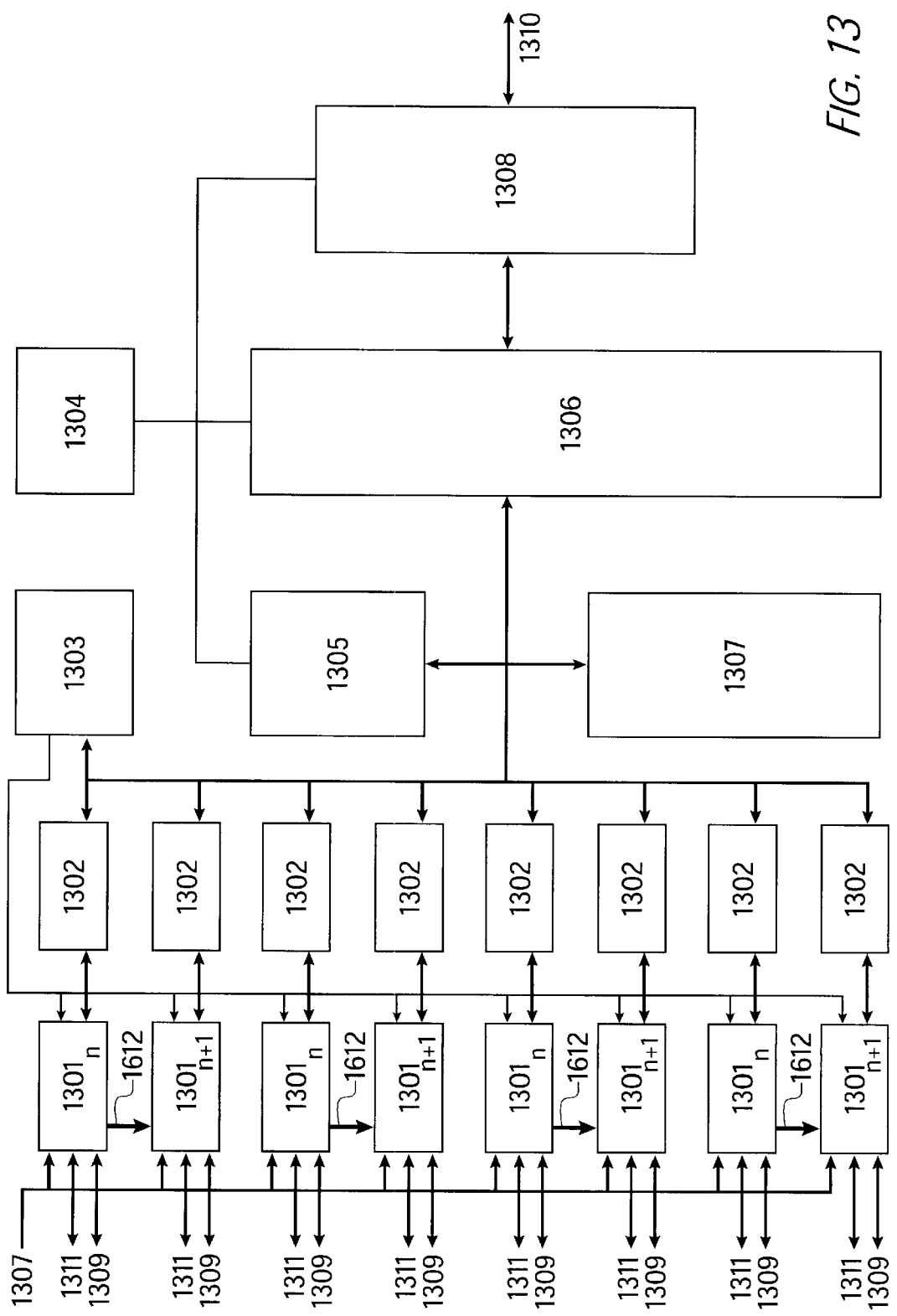
FIG. 13 shows an example implementation of an IO and memory bus system according to the present invention.

FIG. 13 shows an example of implementation of an IO and memory bus system. 1310 forms the RAM bus connecting RAM bus interface (1308) to the RAM bus memory. The RAM bus interface is connected to a cache RAM (1306). A tag RAM (1307) and a cache controller (1305) are provided for cache RAM (1306). With the help of the cache controller and tag RAM, a check is performed to determine whether the required data is in the cache memory or whether it must be loaded out of the external RAM bus memory. Cache RAM, cache controller and RAM bus interface are controlled by a state machine (1304). The cache is a known implementation.

Arbiter (1303) regulates access of individual bus segments to the cache RAM and thus also to external memory. In this exemplary implementation, access to eight bus segments is possible. Each connection to a bus segment (1309) has a bus IO (1301) and an address generator (1302). In addition, each bus IO is also connected to the primary logic bus (1307) and to an internal test bus (1311). Every n-th bus IO is connected to the (n+1)-th bus IO, where n is defined as n=(1, 3, 5, . . . ). Through this connection, data requested from memory by the n-th address generator is used by the (n+1)-th segment as the address for a memory access. Indirect addressing of the memory is thus possible. The value of the counter (1509) of segment n indicates a memory location in the RAM. Data from this memory location is transferred to segment (n+1), where it serves as the basic address for addressing the memory.

Figure 14:
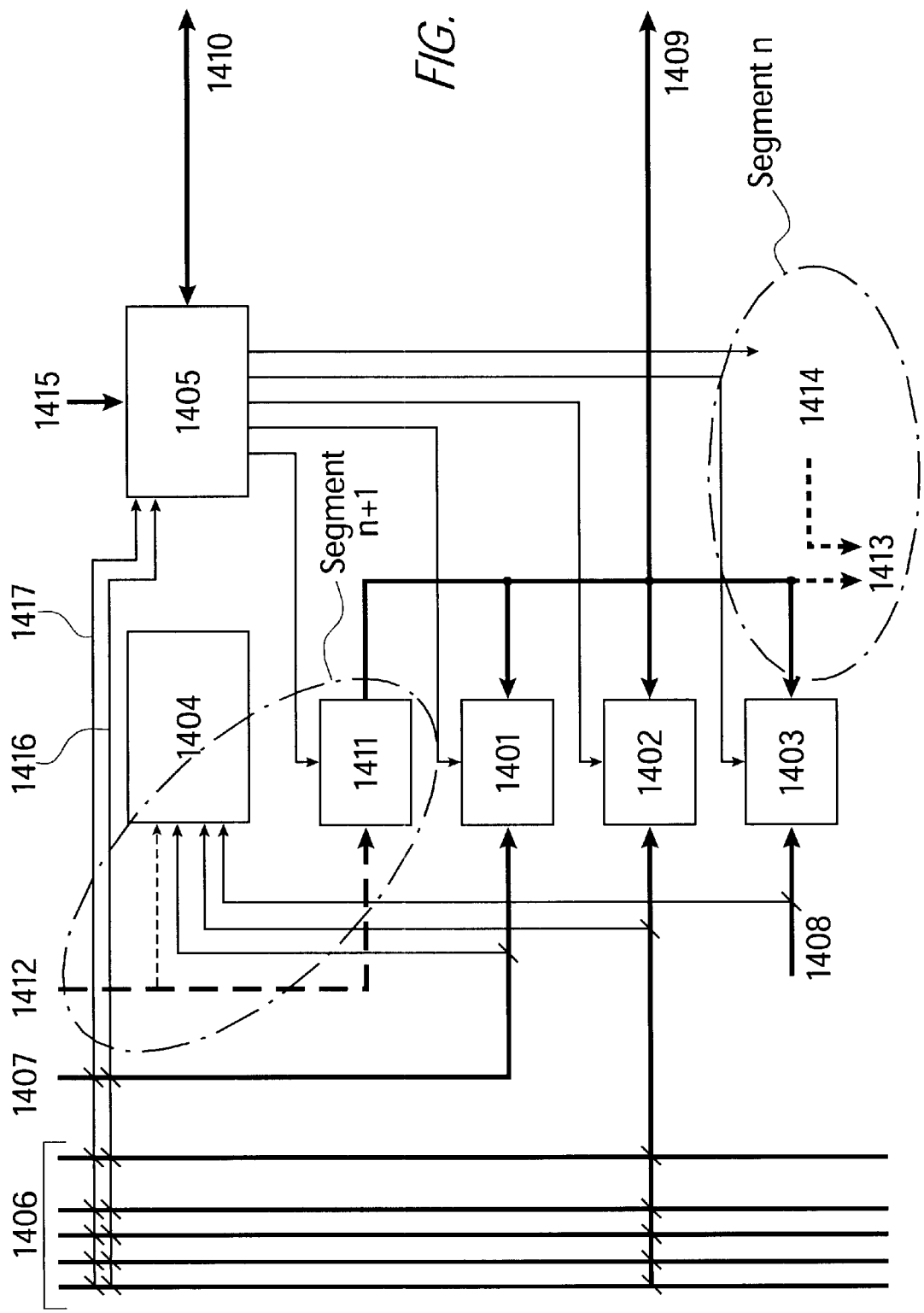
FIG. 14 shows an example Bus IO according to the present invention.

FIG. 14 shows an example bus IO unit. It is connected to the internal bus system (1406), the test bus system (1408) and the primary logic bus (1407). According to an example embodiment, bus (1412) and bus (1413) serve to connect the n-th bus IO to the (n+1)-th bus IO. In other words, bus (1413) is present only with every n-th segment, and bus (1412) is present only with every (n+1)-th segment. The n-th bus IO sends data over the bus (1413), and the (n+1)-th bus IO receives this data over the bus (1412). Bus systems (1406, 1407, 1412) are connected by gates (1401, 1402, 1403, 1411) to bus (1409) which connects the bus IO to the address generator. The arbiter (1404) selects a bus system (1406, 1407, 1412) for data transmission and delivers a control signal to the state machine (1405) which in turn controls gates (1401, 1402, 1403, 1411). In addition, state machine (1405) also sends control signals (1410) to the address generator and RAM.

Two Example Possibilities are as Follows:

a) Segment n: State machine (1405) receives from the address generator a configuration signal (1415) which determines whether indirect addressing is to take place. After a read trigger signal (1416) from internal bus (1406) or primary logic bus (1407), state machine (1405) enables the respective gate (1401, 1402, 1403, 1411) and generates control signals (1410). The memory location addressed by the loadable incrementer/decrementer (1509) is read out. Data contained in the RAM memory location is not sent back to the bus but instead is transmitted by the bus (1413) to the (n+1)-th segment, where it serves as a basic address for addressing the RAM. After having received data from the RAM, the state machine (1405) delivers an acknowledge signal for synchronization to state machine (1414), which controls the sequence in indirect addressing. This state machine (1414) is referred to below as ind state machine. It generates all the necessary control signals and sends them to the following segment (1413).

b) Segment (n+1): The (n+1)-th segment receives data transmitted from the n-th segment over the bus (1412). Arbiter (1404) receives a write signal and sends a request to the state machine, which enables gate (1411). Gate (1411) adds the internal address of the basic address entry to the data from 1412, so that decoder (1502) enables the basic address latches.

Figure 15A:
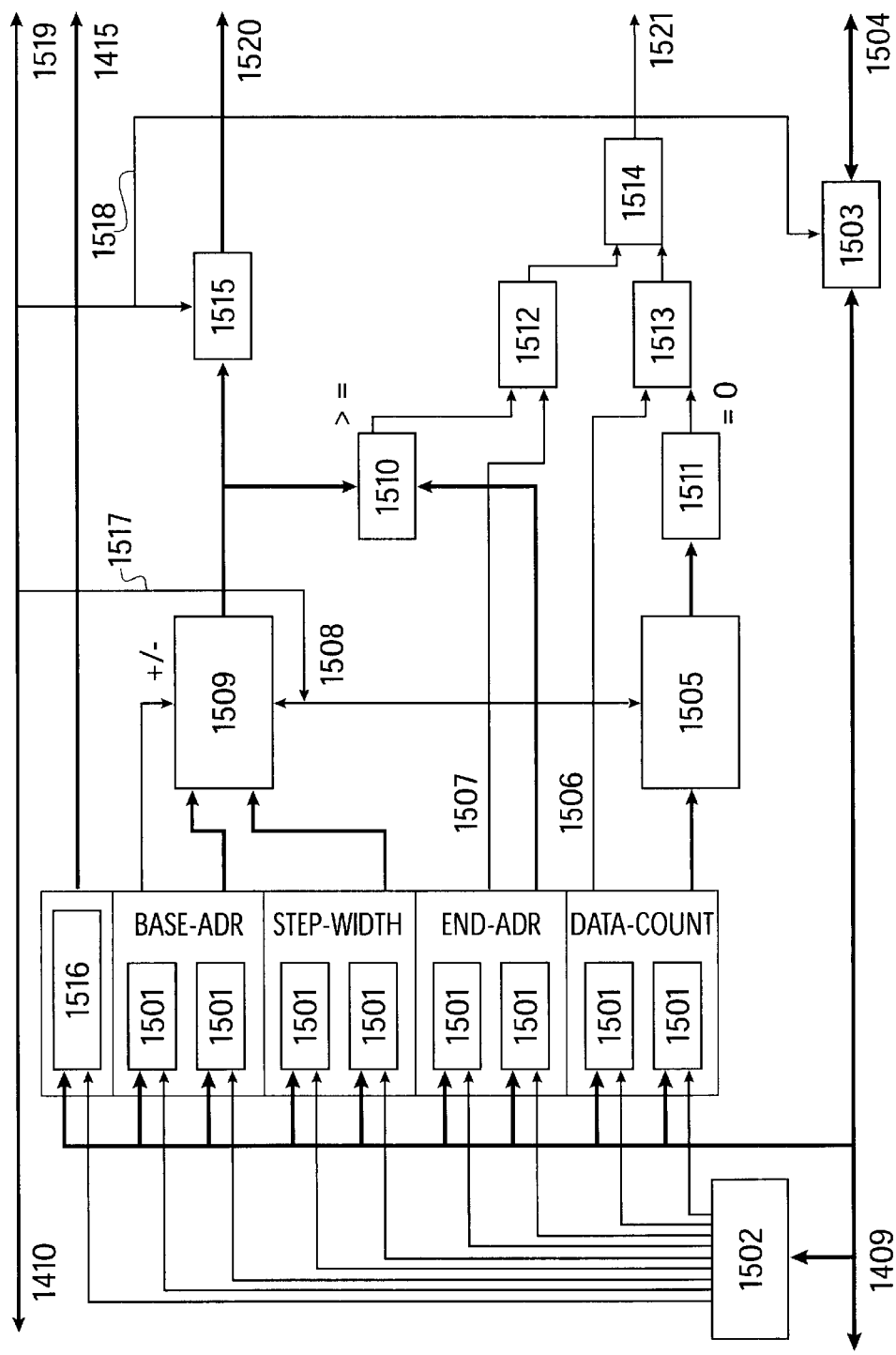
FIG. 15a shows an example address generator according to the present invention.

FIG. 15a shows the address generator. Data and address information is transmitted from the bus IO to the address generator over the bus (1409). Bus (1410) transmits control signals CLK (1517, 1508) and the output enable signal (1518) as well as control signals to RAM (1519). The output enable signal (1518) enables the gates (1503, 1515). Gate (1503) switches data from bus (1409) to data bus (1504) to the RAM. Gate (1515) switches the addresses thus generated to address bus (1520) leading to the RAM.

Addresses are generated as follows: Four entries in the address generator generate addresses. Each entry is stored in two latches (1501), with one latch storing the higher-order address and the other latch storing the lower-order address. The basic address entry contains the start address of a memory access. The step width entry is added to or subtracted from the basic address in loadable incrementer/decrementer (1509). The (incrementing/decrementing) function of loadable incrementer/decrementer (1509) is coded in one bit of the basic address and transmitted to loadable incrementer/decrementer (1509).

The end address is stored in the end address entry, and one bit is encoded according to whether address generation is terminated on reaching the end address or whether the end address entry is ignored. If the counter counts up to an end address, the value of the end address entry is compared with the initial value of the loadable incrementer/decrementer. This takes place in the comparator (1510), which generates a high as soon as the end address is reached or exceeded. With an active enable end address signal (1507), the AND gate (1512) delivers this high to the OR gate (1514), which then relays a trigger signal (1521) to the primary logic bus.

The data count entry contains the number of data transfers and thus of the addresses to be calculated. Here again, one bit in the data count entry determines whether this function is activated and the enable data counter signal (1506) is sent to the AND gate (1513) or whether the data count entry is ignored. Counter (1505) receives the value of the data count entry and decrements it by one with each clock pulse. Comparator (1511) compares the value of counter (1505) [with] zero and delivers a signal to AND gate (1513). If enable data counter signal (1506) is active, the signal of comparator (1511) is sent to OR gate (1514) and as trigger signal (1521) to the primary logic bus.

Bus (1409) contains control signals and addresses for the decoder (1502), which selects one of the latches (1501)

according to the address. Configuration register (1516) can also be controlled by decoder (1502), determining whether the segment is used for indirect addressing. Data of the configuration register is transmitted to the bus IO of the segment over connection (1415).

Figure 15B:
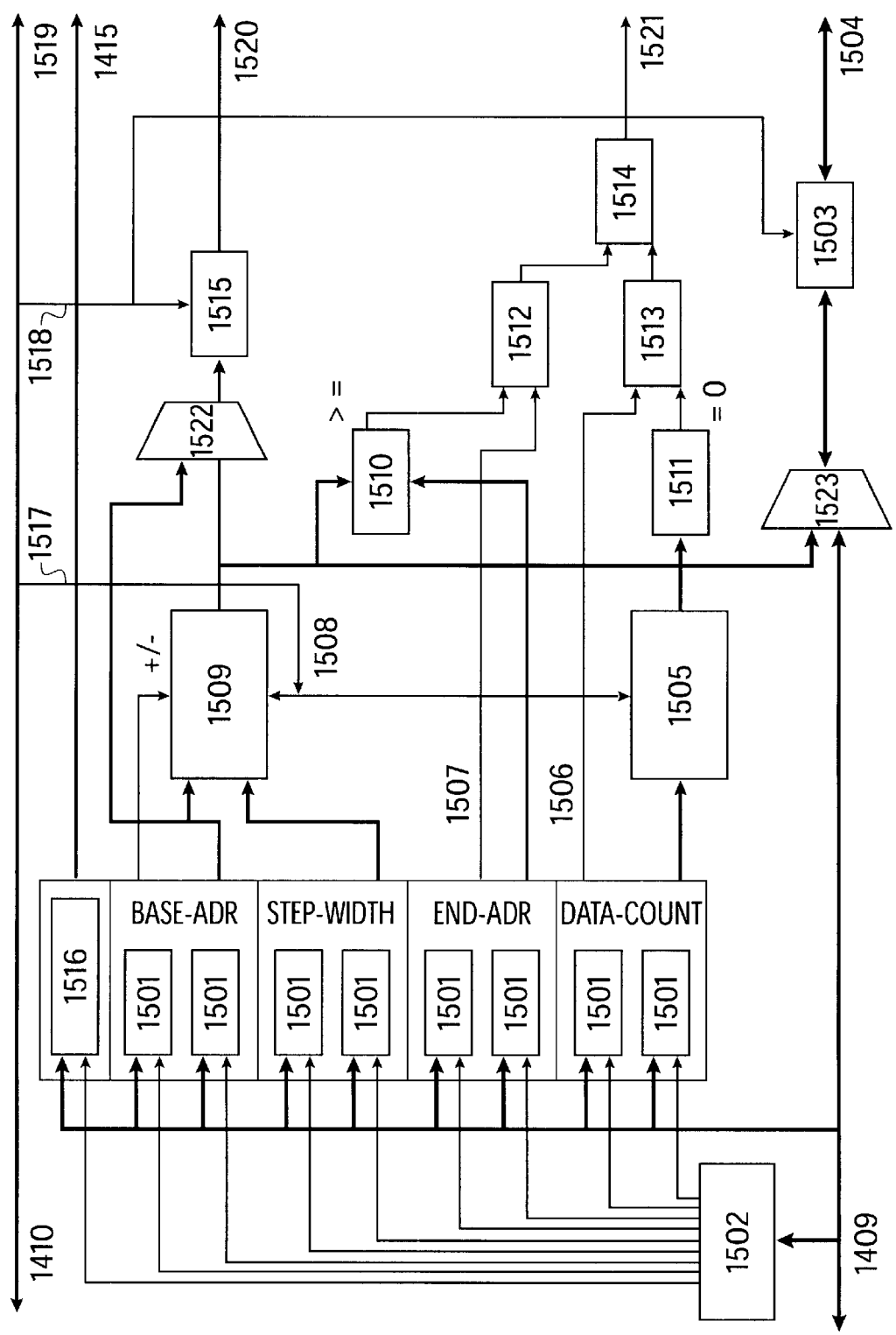
FIG. 15b shows another example address generator according to the present invention, generating end-of-data identification.

FIG. 15b shows a modification of the address generator from FIG. 15a, which deposits the end address of the data block at the beginning of a data block in the memory. The advantage of this design is that with a variable size of the data block, the end is defined precisely for subsequent access. This structure corresponds basically to the structure of the address generator from FIG. 15a, but with the addition of two multiplexers (1522, 1523) and an additional entry in the configuration register (1523). This entry is called the calculate end address and determines whether the end address of the data block is deposited as the first entry of the data block at the location defined by the base address entry. These multiplexers are controlled by state machine (1405). Multiplexer (1522) serves to switch the basic address or output of counter (1509) to gate (1515). Multiplexer (1523) switches either data coming from bus (1404) or the output of counter (1509) to gate (1503).

Figure 15C:
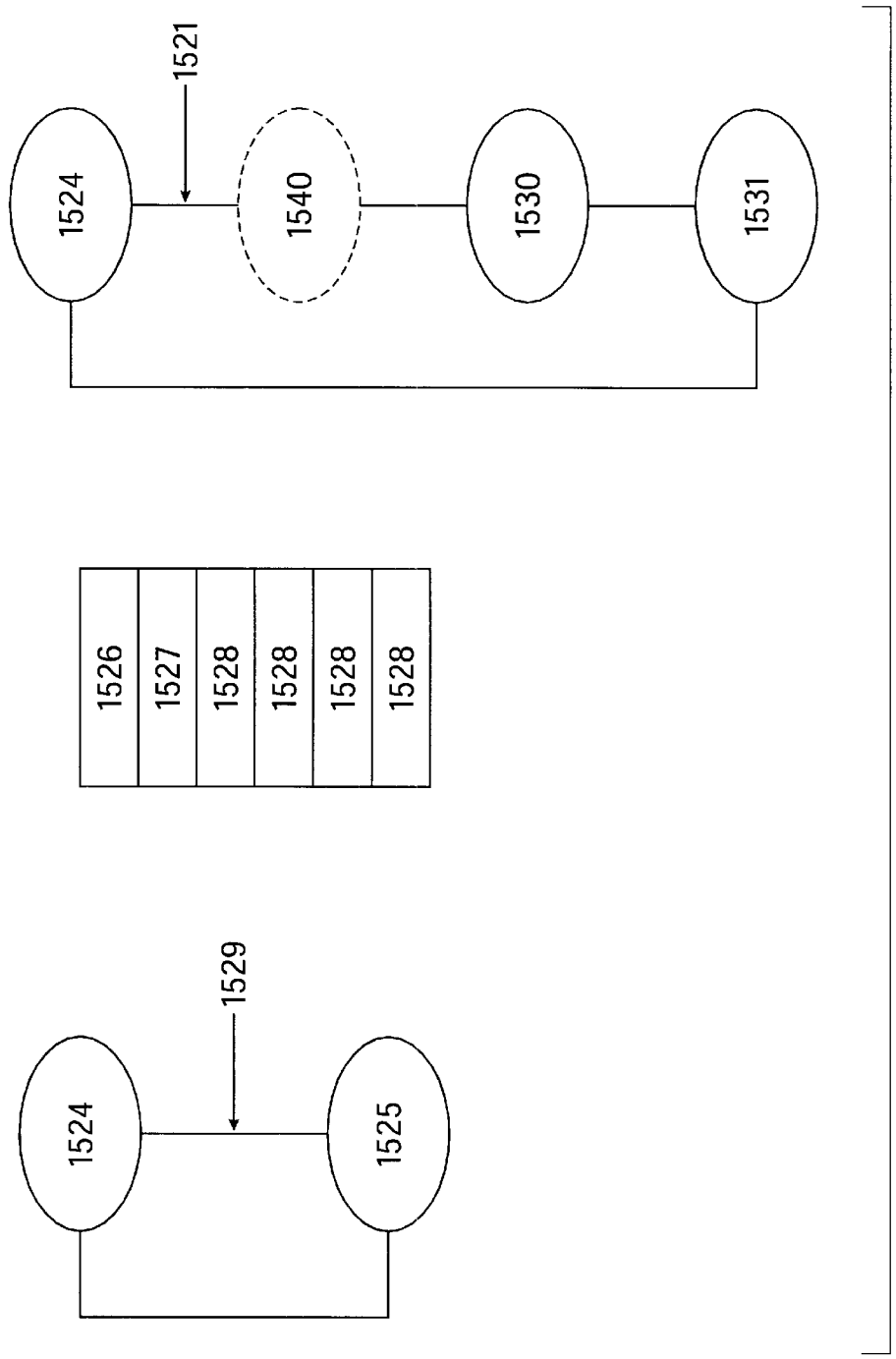
FIG. 15c shows an example function sequence with the address generator with end-of-data identification according to the present invention.

FIG. 15c shows the sequence in the state machine and the pattern of memory access by the address generator shown in FIG. 15b. State machine (1405) is first in the IDLE state (1524). If the calculate end address entry is set in configuration register (1523), after writing step width (1529), state machine (1405) goes into state (1525) where the address for RAM access is written into the loadable incrementer/decrementer from the basic address entry, and the step width is added or subtracted, depending on counter mode (incrementing/decrementing). The RAM is accessed and the state machine returns to IDLE state (1524). The following data transfers are performed as specified by the basic addresses and step width entries. The pattern in memory is thus as follows. Basic address (1526) has not been written. First entry (1527) is in the position defined by the basic address plus (minus) the step width. The next entries (1528) follow one another at step width intervals.

When the end of the transfer has been reached, a trigger signal is generated (1521). On the basis of the trigger signal (1521) or an external trigger signal (1417), state machine (1405) goes from IDLE state (1524) into state (1530), where multiplexers (1522, 1523) are switched, so that the basic address is applied to the input of gate (1515), and the address is applied to gate (1503) after the end of the data block. Then state machine (1405) enters state (1531) and writes the address to the RAM at the position of the basic address after the end of the data block. The pattern in memory is then as follows. The entry of basic address (1526) indicates the address after the end of the data block. The first entry in the data block is at address (1527), and then the remaining entries follow. Another possible embodiment of the state machine is for the state machine to first correct the count in 1509 on the basis of one of trigger signals (1521 or 1417) so that 1509 indicates the last data word of the data block. This is implemented technically by performing the inverse operation to that preset in 1509, i.e., if 1509 adds the step width according to the presettings, the step width is now subtracted; if 1509 subtracts according to the presettings, it is added. To perform the correction, an additional state (1540) is necessary in the state machine described below in conjunction with FIG. 15c to control 1509 accordingly.

Figure 16:
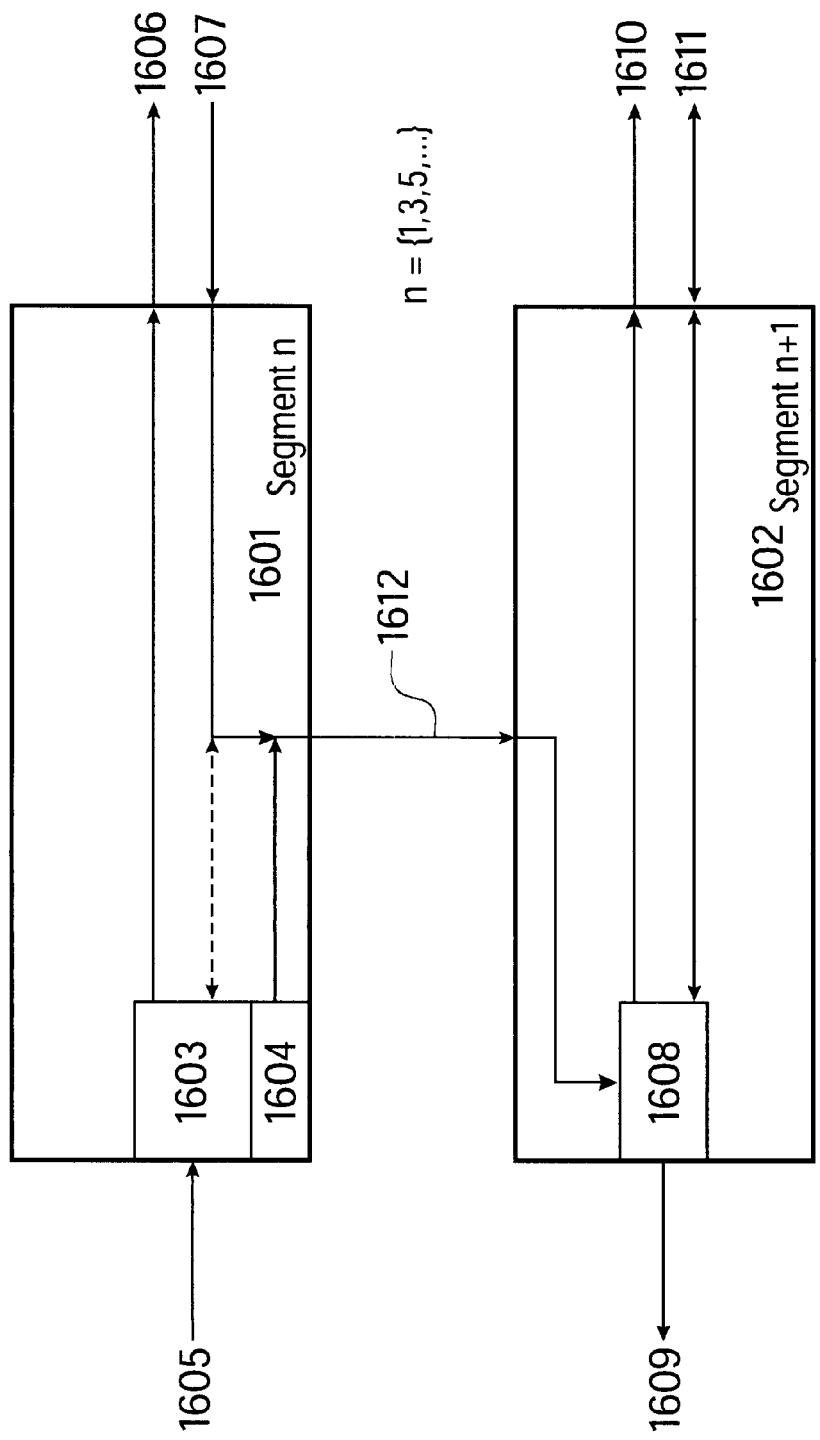
FIG. 16 shows an interaction of two segments in indirect addressing according to an example embodiment of the present invention.

FIG. 16 shows the interaction of multiple segments in indirect addressing. Segment n (1601) receives a read signal over the bus (1605) (primary logic bus (1407) or internal bus (1406)). Bus IO (1603) enables the respective gate and generates the required control signals. The memory location determined by 1509 is addressed. Data (1607) coming from the RAM is sent to segment (n+1) (1602). Ind state machine (1604) generates the required control signals and likewise sends them to segment (n+1) (1602). In segment (n+1) (1602), signals pass through gate (1411) of bus IO (1608) described in conjunction with FIG. 14, where an address is added for decoder (1502) described in conjunction with FIG. 15, so that the basic address entry of the address generator (1608) is addressed by segment (n+1) (1602). Data coming from segment n (1601) thus serves as the basic address in segment (n+1) (1602), i.e., read-write access over bus (1609) (primary logic bus (1407) or internal bus (1406)) can use this basic address for access to the RAM. Bus (1610) serves to transmit addresses to the RAM, and bus (1612) transmits data to and from the RAM, depending on whether it is a read or write access.

Figure 17:
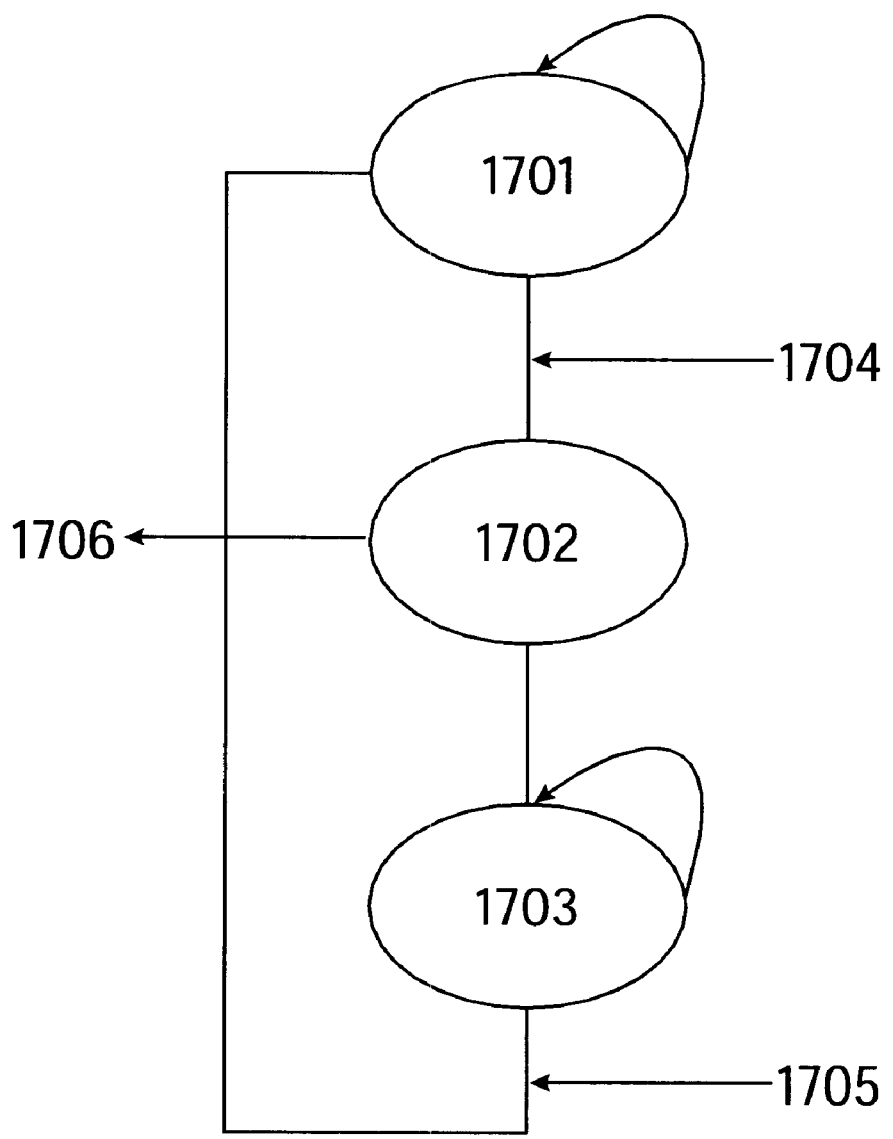
FIG. 17 shows an example state machine for indirect addressing according to the present invention.

FIG. 17 illustrates the ind state machine. The basic state is the IDLE state (1701). It remains in this state until the acknowledge signal of state machine (1405) from FIG. 14 arrives. Then ind state machine goes into a write state (1702), generating a write enable signal which is sent with the data to segment (n+1), where it serves to activate the decoder selecting the various entries. Next it enters a wait_for_ack state. After the acknowledge signal of segment (n+1), the ind state machine returns to the IDLE state (1701).

Definition of Terms

ADR-GATE: Gate which switches addresses to the E-BUS if the unit is in E-BUS MASTER mode.

DFP: Data flow processor according to German Patent No. 44 16 881.

DPGA: Dynamically programmable gate array. Related art.

D flip-flop: Storage element which stores a signal at the rising edge of a clock pulse.

EB-REG: Register that stores the status signals between I-BUS and E-BUS.

E-BUS: External bus system outside a unit.

E-BUS MASTER: Unit that controls the E-BUS. Active.

E-BUS SLAVE: Unit controlled by the E-BUS MASTER. Passive.

E-GATE: Gate which is controlled by the internal state machine of the unit or by the E-BUS MASTER and switches data to the E-BUS.

E-GATE-REG: Register into which data transmitted to the E-BUS over the E-GATE is entered.

E-READ: Flag in the EB-REG indicating that the OUTPUT CELLS have been transferred completely to the E-BUS.

E-WRITE: Flag in the EB-REG indicating that the E-BUS has been transferred completely to the INPUT CELLS.

Flag: Status bit in a register, indicating a state.

FPGA: Field programmable gate array. Related art.

Handshake: Signal protocol where a signal A indicates a state and another signal B confirms that it has accepted signal A and responded to it.

INPUT CELL: Unit transmitting data from the E-BUS to an I-BUS.

I-BUSn (also I-BUS): Internal bus system of a unit, which may also consist of bundles of individual lines, where n indicates the number of the bus.

II-BUSn (also II-BUS): Internal bus system of a unit, which may also consist of bundles of individual lines, with n denoting the number of the bus. The bus is driven by an INPUT CELL and goes to logic inputs.

IO-BUSn (also IO-BUS): Internal bus system of a unit, which may also consist of bundles of individual lines, with n denoting the number of the bus. The bus is driven by logic outputs and goes to an OUTPUT CELL. n indicates the number of the bus.

I-GATE: Gate that switches data to the I-BUS.

I-GATE-REG: Register which is controlled by the internal state machine or by E-BUS MASTER and into which data transmitted over the I-GATE to the I-BUS is entered.

I-READ: Flag in the EB-REG indicating that the INPUT CELLs have been completely transferred to the I-BUS.

I-WRITE: Flag in the EB-REG indicating that the I-BUS has been completely transferred to the OUTPUT CELLs.

Edge cell: Cell at the edge of a cell array, often with direct contact with the terminals of a unit.

Configuring: Setting the function and interconnecting a logic unit, a (FPGA) cell (logic cell) or a PAE (see reconfiguring).

Primary logic unit (PLU): Unit for configuring and reconfiguring a PAE or logic cell. Configured by a microcontroller specifically designed for this purpose.

Latch: Storage element which usually relays a signal transparently during the H level and stores it during the L level. Latches where the function of levels is exactly the opposite are sometimes used in PAEs. An inverter is then connected before the clock pulse of a conventional latch.

Logic cells: Configurable cells used in DFPs, FPGAs, DPGAs, fulfilling simple logical or arithmetic functions, depending on configuration.

MASTER: Flag in EB-REG showing that the E-BUS unit is a MASTER.

MODE PLUREG: Register in which the primary logic unit sets the configuration of an INPUT/OUTPUT CELL.

OUTPUT CELL: Unit that transmits data from an I-BUS to the E-BUS.

PAE: Processing array element: EALU with O-REG, R-REG, R20-MUX, F-PLUREG, M-PLUREG, BM UNIT, SM UNIT, sync UNIT, state-back UNIT and power UNIT.

PLU: Unit for configuring and reconfiguring a PAE or a logic cell. Configured by a microcontroller specifically designed for this purpose.

REQ-MASTER: Flag in the EB-REG indicating that the unit would like to become E-BUS MASTER.

RS flip-flop: Reset/set flip-flop. Storage element which can be switched by two signals.

SET-REG: Register indicating that data has been written in an I-GATE-REG or E-GATE-REG but not yet read.

STATE-GATE: Gate switching the output of the SET-REG to the E-BUS.

Gate: Switch that relays or blocks a signal. Simple comparison: relay.

Reconfiguring: New configuration of any number of PAEs or logic cells while any remaining number of PAEs or logic cells continue their own function (see configuring).

State machine: Logic which can assume miscellaneous states. The transitions between states depend on various input parameters. These machines are used to control complex functions and belong to the related art.

What is claimed is:

1. A bus system, comprising:
a plurality of at least one of individual lines, buses, and subbuses within at least one of a unit including at least one of a data flow processor (DFP), a field programmable gate array (FPGA), a dynamically programmable gate array (DPGA), and a unit having a multi-dimensional programmable cell architecture, the plurality of the at least one of individual lines, buses and subbuses being bundled,
wherein the plurality of the at least one individual lines, buses and subbuses at least one of combines multiple units and connects at least one of memories and peripherals.

2. The bus system according to claim 1, wherein at least one interface combines the lines and creates the bus system.

3. The bus system according to claim 2 wherein at least one state machine controls the at least one interface.

4. The bus system according to claim 3, wherein the at least one state machine controls an external bus.

5. The bus system according to claim 2, wherein the at least one interface uses at least one internal bus system, the at least one internal bus system including multiple lines for reading and writing.

6. The bus system according to claim 2, wherein the at least one interface uses at least one internal bus system, the at least one internal bus system including multiple lines for at least one of reading and writing.

7. The bus system according to claim 2, wherein the at least one interface uses at least one internal bus system, the at least one internal bus system including multiple lines operating as a hybrid of multiple lines for reading and writing and multiple lines for at least one of reading and writing.

8. The bus system according to claim 2, further comprising:
a register indicating whether data is stored in the at least one interface.

9. The bus system according to claim 1, further comprising:
an address generator generating addresses for the units to be contacted via the bus system.

10. The bus system according to claim 1, further comprising:
a register for managing and controlling the bus system.

11. The bus system according to claim 1, wherein the bus is controlled by a unit which accesses a plurality of lower-level units.

12. The bus system according to claim 11, wherein a lower-level unit requests a bus control.

13. The bus system according to claim 1, wherein standard bus systems are used.

14. The bus system according to claim 1, wherein the unit includes additional ordinary connections in a manner customary with at least one of the DFP, the FPGA and the DPGA.

15. A bus system, comprising:
a plurality of at least one of individual lines, buses, and subbuses within at least one of a unit including at least one of a data flow processor (DFP), a field programmable gate array (FPGA), a dynamically programmable gate array (DPGA), and a unit having a multi-dimensional programmable cell architecture by means of which multiple units can be combined and/or memories and/or peripherals can be connected, the plurality of the at least one of individual lines, buses and subbuses being bundled,
wherein the plurality of the at least one individual lines, buses and subbuses at least one of combines multiple units and connects at least one of memories and peripherals, and
wherein a bus control is transferred dynamically from one unit to another.

16. A bus system, comprising:
a plurality of at least one of individual lines, buses and subbuses within at least one of a unit including at least one of a data flow processor (DFP), a field programmable gate array (FPGA) a dynamically programmable gate array (DPGA), and a unit having a multi-dimensional programmable cell architecture, the plurality of the at least one of individual lines, buses and subbuses being bundled, wherein the plurality of the at least one individual lines, buses and subbuses at least one of combines multiple units and connects at least one of memories and peripherals, wherein at least one interface combines the lines and creates the bus system, and wherein the at least one interface is at least one of implemented directly on the unit and is created via a configuration of logic cells.

17. The bus system according to claim 16, wherein the logic cell is a cell in at least one of the DFP, the FPGA, the DPGA and a unit that fulfills at least one of simple logical functions and arithmetic functions according to the configuration.

18. A bus system, comprising:

a plurality of at least one of individual lines, buses, and subbuses within at least one of a unit including at least one of a data flow processor (DFP), a field programmable gate array (FPGA), a dynamically programmable gate array (DPGA), and a unit having a multi-dimensional programmable cell architecture, the plurality of the at least one of individual lines, buses and subbuses being bundled, wherein the plurality of the at least one individual lines, buses and subbuses at least one of combines multiple units and connects at least one of memories and peripherals, wherein at least one interface combines the lines and creates the bus system, and wherein the at least one interface is configured by at least one of a primary logic unit and the unit itself.

* * * * *

UNITED STATES PATENT AND TRADEMARK OFFICE
CERTIFICATE OF CORRECTION

PATENT NO.    : 6,338,106 B1
DATED         : January 8, 2002
INVENTOR(S)   : Vorbach et al.

It is certified that error appears in the above-identified patent and that said Letters Patent is hereby corrected as shown below:

Column 6,
Line 4, afer "E-BUS SLAVE" delete "In the";
Line 5, before "example" insert -- In the --; and Column 11,
Line 62, change "Two Example Possibilities are as Follows:" to -- Two example possibilities are as follows: --.

Signed and Sealed this

Eighteenth Day of June, 2002

Attest:

Attesting Officer

JAMES E. ROGAN
Director of the United States Patent and Trademark Office

(12) EX PARTE REEXAMINATION CERTIFICATE (8679th)
United States Patent
Vorbach et al.

(10) Number: US 6,338,106 C1
(45) Certificate Issued: Nov. 22, 2011

(54) I/O AND MEMORY BUS SYSTEM FOR DFPS AND UNITS WITH TWO OR MULTI-DIMENSIONAL PROGRAMMABLE CELL ARCHITECTURES

(75) Inventors: Martin Vorbach, Karlsruhe (DE); Robert Münch, Karlsruhe (DE)

(73) Assignee: Pact XPP Technologies AG, Munich (DE)

Reexamination Request:
No. 90/010,979, May 4, 2010
No. 90/011,087, Jul. 8, 2010

Reexamination Certificate for:
Patent No.: 6,338,106
Issued: Jan. 8, 2002
Appl. No.: 09/335,974
Filed: Jun. 18, 1999

Certificate of Correction issued Jun. 18, 2002.

Related U.S. Application Data

(63) Continuation of application No. PCT/DE97/03013, filed on Dec. 21, 1997, and a continuation-in-part of application No. 08/947,254, filed on Oct. 8, 1997, now Pat. No. 6,119,181.

(30) Foreign Application Priority Data

Dec. 20, 1996 (DE) .......................................... 196 54 595

(51) Int. Cl.
*G06F 15/78* (2006.01)
*G06F 15/76* (2006.01)
*G11C 07/10* (2006.01)

(52) U.S. Cl. ............................ 710/100; 712/11; 716/117
(58) Field of Classification Search .................. 710/100
See application file for complete search history.

(56) References Cited

To view the complete listing of prior art documents cited during the proceedings for Reexamination Control Numbers 90/010,979 and 90/011,087, please refer to the USPTO's public Patent Application Information Retrieval (PAIR) system under the Display References tab.

*Primary Examiner* — B. James Peikari

(57) ABSTRACT

A general bus system is provided which combines a number of internal lines and leads them as a bundle to the terminals. The bus system control is predefined and does not require any influence by the programmer. Any number of memories, peripherals or other units can be connected to the bus system (for cascading).

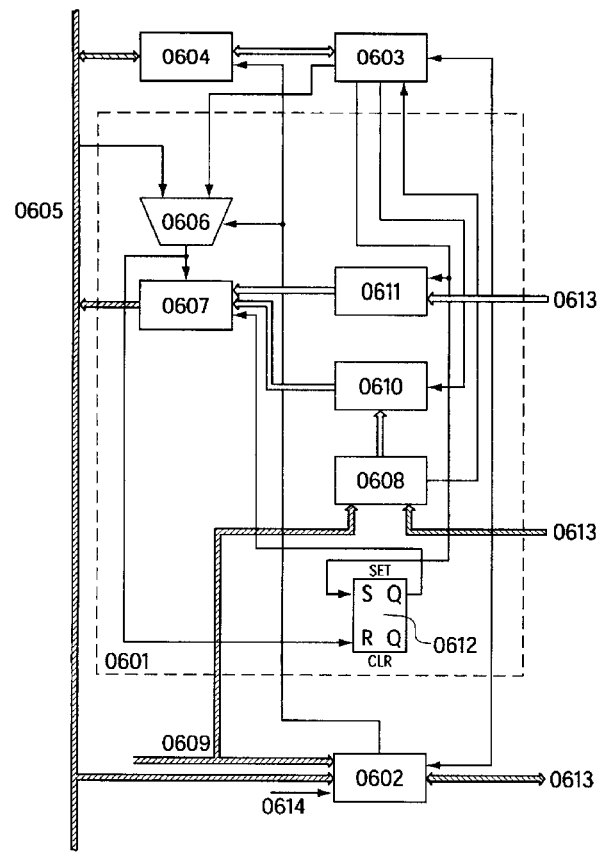

US 6,338,106 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

Claims 2, 8-11, 13-16 and 18 are determined to be patentable as amended.

Claims 3-7, 12 and 17, dependent on an amended claim, are determined to be patentable.

New claims 19-33 are added and determined to be patentable.

2. [The] *A* bus system [according to claim 1], *comprising:*
   *a plurality of individual lines within a reconfigurable processing unit including at least one of a data flow processor (DFP), a field programmable gate array (FPGA), a dynamically programmable gate array (DPGA), and a unit having a multi-dimensional programmable cell architecture, the plurality of individual lines being bundled and at least one of combining multiple units and connecting at least one of memories and peripherals;*
   wherein:
      at least one interface *fixedly defines a bus function;*
      *the plurality of individual lines are dynamically coupled to the at least one interface; and*
      *the at least one interface* combines the *dynamically coupled* lines *to create a logical collection of lines, the logical collection being defined by assignment, by the at least one interface* and [creates] *to the dynamically coupled lines, of the fixedly defined bus function, thereby creating* the bus system.

8. [The] *A* bus system[according to claim 2], [further] comprising:
   *a plurality of at least one of individual lines, buses, and subbuses within at least one of a unit including at least one of a data flow processor (DFP), a field programmable gate array (FPGA), a dynamically programmable gate array (DPGA), and a unit having a multi-dimensional programmable cell architecture, the plurality of the at least one of individual lines, buses and subbuses being bundled, wherein the plurality of the at least one individual lines, buses and subbuses at least one of combines multiple units and connects at least one of memories and peripherals, and wherein at least one interface combines the lines and creates the bus system; and*
   a register indicating whether data is stored in the at least one interface.

9. The bus system according to claim [1] *2*, further comprising:
   an address generator generating addresses for the units to be contacted via the bus system.

10. The bus system according to claim [1] *2*, further comprising:
    a register for managing and controlling the bus system.

11. The bus system according to claim [1] *2*, wherein the bus is controlled by a unit which accesses a plurality of lower-level units.

13. The bus system according to claim [1] *2*, wherein standard bus systems are used.

14. The bus system according to claim [1] *2*, wherein the *reconfigurable processing* unit includes additional ordinary connections in a manner customary with at least one of the DFP, the FPGA and the DPGA.

15. A bus system, comprising:
    a plurality of [at least one of] individual lines[, buses, and subbuses] within [at least one of] a *reconfigurable processing* unit including at least one of a data flow processor (DFP), a field programmable gate array (FPGA), a dynamically programmable gate array (DPGA), and a unit having a multi-dimensional programmable cell architecture by means of which multiple units can be combined and/or memories and/or peripherals can be connected, the plurality of [the at least one of] individual lines[, buses and subbuses] being bundled, wherein:
       *at least one interface fixedly defines a bus function;*
       *the plurality of individual lines are dynamically coupled to the at least one interface;*
       *the at least one interface combines the dynamically coupled lines to create a logical collection of lines, the logical collection being defined by assignment, by the at least one interface and to the dynamically coupled lines, of the fixedly defined bus function;*
       the plurality of [the at least one] individual lines[, buses and subbuses] at least one of combines multiple units and connects at least one of memories and peripherals[,] *;and* [wherein]
       a bus control is transferred dynamically from one unit to another.

16. A bus system comprising:
    a plurality of [at least one of] individual lines[, buses and subbuses] within [at least one of] a *reconfigurable processing* unit including at least one of a data flow processor (DFP), a field programmable gate array (FPGA), a dynamically programmable gate array (DPGA), and a unit having a multi-dimensional programmable cell architecture, the plurality of [the at least one of] individual lines[, buses and subbuses] being bundled, wherein:
       the plurality of [the at least one] individual lines[, buses and subbuses] at least one of combines multiple units and connects at least one of memories and peripherals[, wherein] *;*
       at least one interface [creates] *fixedly defines a bus function;*
       *the plurality of individual lines are dynamically coupled to the at least one interface;*
       *the at least one interface* combines the *dynamically coupled* lines *to create a logical collection of lines, the logical collection being defined by assignment, by the at least one interface* and *to the dynamically coupled lines, of the fixedly defines bus function, thereby creating* the bus system[,] *;* and [wherein]
       the at least one interface is at least one of implemented directly on the unit and is created via a configuration of logic cells.

18. A bus system, comprising:
    a plurality of [at least one of] individual lines[, buses, and subbuses] within [at least one of] a *reconfigurable pro-*

*cessing* unit including at least one of a data flow processor (DFP), a field programmable gate array (FPGA), a dynamically programmable gate array (DPGA), and a unit having a multi-dimensional programmable cell architecture, the plurality of [the at least one of] individual lines[, buses and subbuses] being bundled, wherein:

the plurality of [the at least one] individual lines[, buses and subbuses] at least one of combines multiple units and connects at least one of memories and peripherals[, wherein];

at least one interface *fixedly defines a bus function;*

*the plurality of individual lines are dynamically coupled to the at least one interface;*

*the at least one interface* combines the *dynamically coupled* lines [creates] to create a logical collection of lines, the logical collection being defined by assignment, by the at least one interface and to *to the dynamically coupled lines, of the fixedly defines bus function, thereby creating* the bus system[.]; and [wherein]

the at least one interface is configured by at least one of a primary logic unit and the *reconfigurable processing* unit itself.

19. The bus system according to claim 8, wherein at least one state machine controls the at least one interface.

20. The bus system according to claim 8, wherein the at least one interface uses at least one internal bus system, the at least one internal bus system including multiple lines for reading and writing.

21. The bus system according to claim 8, wherein the at least one interface uses at least one internal bus system, the at least one internal bus system including multiple lines for at least one of reading and writing.

22. The bus system according to claim 8, wherein the at least one interface uses at least one internal bus system, the at least one internal bus system including multiple lines operating as a hybrid of multiple lines for reading and writing and multiple lines for at least one of reading and writing.

23. The bus system according to claim 8, further comprising:

an address generator generating addresses for units to be contacted via the bus system.

24. The bus system according to claim 8, further comprising:

a register for managing and controlling the bus system.

25. The bus system according to claim 8, wherein the bus system is controlled by a unit which accesses a plurality of lower-level units.

26. The bus system according to claim 25, wherein a lower-level unit requests a bus control.

27. The bus system according to claim 8, wherein standard bus systems are used.

28. The bus system according to claim 8, wherein the unit includes additional ordinary connections in a manner customary with at least one of the DFP, the FPGA and the DPGA.

29. The bus system according to claim 15, further comprising:

a register indicating whether data is stored in the at least one interface.

30. The bus system according to claim 16, further comprising:

a register indicating whether data is stored in the at least one interface.

31. The bus system according to claim 18, further comprising:

a register indicating whether data is stored in the at least one interface.

32. The bus system according to claim 31, wherein the at least one state machine controls an external bus.

33. A bus system comprising:

a plurality of individual lines within a reconfigurable processing unit including at least one of a data flow processor (DFP), a field programmable gate array (FPGA), a dynamically programmable gate array (DPGA), and a unit having a multi-dimensional programmable cell architecture, the plurality of individual lines being bundled and at least one of combining multiple units and connecting at least one of memories and peripherals:

wherein:

at least one interface fixedly defines a bus function not initially assigned to the plurality of individual lines; and the plurality of individual lines are dynamically coupled to the at least one interface, the at least one interface thereby combining the plurality of individual lines such that the plurality of individual lines thereby create a bus of the bus system, to which bus the bus function is assigned.

\* \* \* \* \*